(12) United States Patent
Sullivan

(10) Patent No.: US 7,610,993 B2
(45) Date of Patent: Nov. 3, 2009

(54) FLOW-THROUGH MUFFLERS WITH OPTIONAL THERMO-ELECTRIC, SOUND CANCELLATION, AND TUNING CAPABILITIES

(76) Inventor: John Timothy Sullivan, 11339 Barley Field Way, Marriottsville, MD (US) 21104-1346

( * ) Notice: Subject to any disclaimer, the term of this patent is extended or adjusted under 35 U.S.C. 154(b) by 311 days.

(21) Appl. No.: 11/211,701

(22) Filed: Aug. 26, 2005

(65) Prior Publication Data

US 2007/0045044 A1    Mar. 1, 2007

(51) Int. Cl.
*F01N 1/08* (2006.01)

(52) U.S. Cl. .................. 181/268; 181/237; 181/251; 181/212

(58) Field of Classification Search ............ 181/268, 181/237, 251, 269, 259, 254, 272, 275, 255, 181/241, 247, 264; 310/306; 322/2 R
See application file for complete search history.

(56) References Cited

U.S. PATENT DOCUMENTS

| | | | |
|---|---|---|---|
| 624,062 A | 5/1899 | Mattews et al. | |
| 1,522,111 A * | 1/1925 | Franck-Philipson | 422/169 |
| 1,611,475 A | 12/1926 | Maxim | |
| 1,684,186 A * | 9/1928 | Kysor | 165/51 |
| 1,695,554 A * | 12/1928 | Markels | 96/113 |
| 1,709,426 A * | 4/1929 | Beery | 181/254 |
| 2,072,372 A * | 3/1937 | Riethmiller | 181/264 |
| 2,116,718 A * | 5/1938 | Stubbs | 123/556 |
| 2,323,891 A * | 7/1943 | Blanchard | 181/238 |
| 2,485,555 A | 10/1949 | Bester | |
| 3,100,140 A * | 8/1963 | Ashley et al. | 422/177 |
| 3,175,105 A * | 3/1965 | Creedon et al. | 310/306 |
| 3,177,972 A * | 4/1965 | Wirt | 181/268 |
| 3,413,096 A * | 11/1968 | Britt | 422/173 |
| 3,679,024 A | 7/1972 | Kirkland, Jr. et al. | 181/49 |
| 3,713,783 A * | 1/1973 | Greipel | 422/171 |
| 3,786,896 A | 1/1974 | Foster | 181/53 |
| 4,059,076 A * | 11/1977 | Kosaka et al. | 123/3 |
| 4,161,657 A | 7/1979 | Shaffer, Jr. | 290/1 R |
| 4,361,206 A | 11/1982 | Tsai | 181/255 |
| 4,520,305 A * | 5/1985 | Cauchy | 322/2 R |

(Continued)

FOREIGN PATENT DOCUMENTS

JP    05106420 A * 4/1993

*Primary Examiner*—Walter Benson
*Assistant Examiner*—Forrest M Phillips
(74) *Attorney, Agent, or Firm*—Bacon & Thomas, PLLC

(57) ABSTRACT

A flow-through muffler includes a plurality of heat conducting walls, baffles, or partitions that together define a plurality of passages arranged to form acoustic waveguides, attenuators, and/or cancellation chambers, the walls, baffles, or partitions increasing a surface area exposed to the exhaust gases to facilitate extraction of heat while attenuating or canceling the resulting sound pressure waves. The muffler may have a cooling arrangement mounted thereon, and thermoelectric generator elements or other heat-powered device, such as a reformer, connected across the heat differential between the cooling arrangement and an exterior surface of the muffler housing that is in thermal contact with the heat conducting walls, bafflers, or partitions. In addition, the muffler may be made tuneable by providing a device for varying a length of one of the passages relative to another passage, and by including a sound cancellation chamber at an intersection of the passages. In addition, the internal surfaces of the muffler may be coated with a catalyst to provide a combination muffler and catalytic converter.

65 Claims, 16 Drawing Sheets

U.S. PATENT DOCUMENTS

| | | | | |
|---|---|---|---|---|
| 4,673,863 A * | 6/1987 | Swarbrick | 322/2 R |
| 4,753,628 A | 6/1988 | Gore | 474/112 |
| 4,753,682 A * | 6/1988 | Cantoni | 136/212 |
| 4,809,812 A | 3/1989 | Flugger | 181/268 |
| 4,943,493 A * | 7/1990 | Vartanian | 429/17 |
| 4,953,660 A * | 9/1990 | Jewell et al. | 181/282 |
| 4,958,701 A * | 9/1990 | Moring, III | 181/282 |
| 5,065,085 A * | 11/1991 | Aspden et al. | 322/2 R |
| 5,174,113 A | 12/1992 | Deville | 60/309 |
| 5,193,635 A * | 3/1993 | Mizuno et al. | 180/65.3 |
| 5,314,009 A * | 5/1994 | Yates et al. | 165/72 |
| 5,378,435 A * | 1/1995 | Gavoni | 422/177 |
| 5,444,197 A | 8/1995 | Flugger | 181/264 |
| 5,484,577 A * | 1/1996 | Buswell et al. | 422/211 |
| 5,527,632 A * | 6/1996 | Gardner | 429/27 |
| 5,530,214 A | 6/1996 | Morehead et al. | 181/255 |
| 5,532,573 A * | 7/1996 | Brown et al. | 322/22 |
| 5,625,245 A * | 4/1997 | Bass | 310/306 |
| 5,733,347 A * | 3/1998 | Lesieur | 48/61 |
| 5,753,383 A | 5/1998 | Cargnelli et al. | 429/13 |
| 5,821,475 A | 10/1998 | Morehead et al. | 181/255 |
| 5,968,456 A * | 10/1999 | Parise | 422/174 |
| 6,079,516 A * | 6/2000 | Pearson | 181/254 |
| 6,089,347 A * | 7/2000 | Flugger | 181/264 |
| 6,105,716 A | 8/2000 | Morehead et al. | 181/255 |
| 6,172,427 B1 * | 1/2001 | Shinohara et al. | 290/40 B |
| 6,199,659 B1 * | 3/2001 | Allman | 181/282 |
| 6,220,387 B1 | 4/2001 | Hoppes et al. | 181/259 |
| 6,254,839 B1 * | 7/2001 | Clawson et al. | 422/190 |
| 6,296,074 B1 * | 10/2001 | Ridlen | 181/272 |
| 6,364,054 B1 | 4/2002 | Bubulka et al. | 181/264 |
| 6,378,471 B1 * | 4/2002 | Yamada et al. | 123/65 PE |
| 6,499,562 B1 * | 12/2002 | Elfinger et al. | 181/251 |
| 6,533,065 B2 * | 3/2003 | Zanker | 181/264 |
| 6,564,902 B1 * | 5/2003 | Saberi | 181/237 |
| 6,598,390 B2 * | 7/2003 | Chang | 60/323 |
| 6,605,773 B2 * | 8/2003 | Kok et al. | 136/242 |
| 6,622,482 B2 * | 9/2003 | Knight et al. | 60/299 |
| 6,986,247 B1 * | 1/2006 | Parise | 60/284 |
| 7,051,522 B2 * | 5/2006 | Yang et al. | 60/320 |
| 7,100,369 B2 * | 9/2006 | Yamaguchi et al. | 60/324 |
| 7,178,332 B2 * | 2/2007 | Sasaki | 60/320 |
| 7,255,197 B2 * | 8/2007 | Horiko | 181/250 |
| 7,380,635 B2 * | 6/2008 | Harris | 181/206 |
| 2002/0033302 A1 * | 3/2002 | Kaneko et al. | 181/232 |
| 2003/0223919 A1 * | 12/2003 | Kwak et al. | 422/174 |
| 2004/0101722 A1 * | 5/2004 | Faye et al. | 429/20 |
| 2004/0118632 A1 * | 6/2004 | Ciray | 181/219 |
| 2004/0144083 A1 * | 7/2004 | Ament | 60/286 |
| 2004/0216451 A1 * | 11/2004 | LaBarge et al. | 60/286 |
| 2004/0244385 A1 * | 12/2004 | Gatecliff et al. | 62/3.3 |
| 2005/0132650 A1 * | 6/2005 | Fisher et al. | 48/197 R |
| 2005/0189166 A1 * | 9/2005 | Kikuchi et al. | 181/237 |
| 2005/0277006 A1 * | 12/2005 | Lawrence | 429/26 |
| 2006/0037244 A1 * | 2/2006 | Clawson | 48/61 |
| 2006/0054381 A1 * | 3/2006 | Takemoto et al. | 181/237 |
| 2006/0254843 A1 * | 11/2006 | Schrandt | 180/219 |
| 2007/0012032 A1 * | 1/2007 | Hu | 60/286 |
| 2007/0033929 A1 * | 2/2007 | Telford et al. | 60/287 |
| 2007/0039725 A1 * | 2/2007 | Valensa et al. | 165/177 |
| 2007/0084116 A1 * | 4/2007 | Ringler et al. | 48/127.9 |
| 2007/0107307 A1 * | 5/2007 | Kirwan et al. | 48/127.9 |
| 2007/0107982 A1 * | 5/2007 | Sullivan | 181/249 |
| 2007/0125072 A1 * | 6/2007 | McCarthy et al. | 60/286 |
| 2007/0246292 A1 * | 10/2007 | Sichau | 181/241 |
| 2007/0246294 A1 * | 10/2007 | Willey | 181/254 |

* cited by examiner

FLOW-THROUGH MUFFLERS WITH OPTIONAL THERMO-ELECTRIC, SOUND CANCELLATION, AND TUNING CAPABILITIES

BACKGROUND OF THE INVENTION

1. Field of the Invention

This invention relates to mufflers, and in particular to high efficiency mufflers arranged to reduce fuel consumption by decreasing back-pressure and therefore load on the engine. The mufflers feature flow-through passages and chambers defined by heat-conducting baffles or partitions that draw energy from the exhaust stream, the passages or chambers being acoustically configured to reduce exhaust noise: (a) by converting kinetic energy of the exhaust stream into heat energy; (b) by isolating and attenuating acoustic waves within the passages or chambers, and/or by partial or complete cancellation of the acoustic waves.

The use of heat conducting baffles or passages enables the mufflers of the preferred embodiments to be used not only for sound reduction, but also for electricity generation. This is accomplished by using the heat carried away by the baffles or partitions to power thermoelectric generators to further increase fuel efficiency. In addition, the heat extracted by the baffles of the flow-through muffler may be used for other purposes such as in a reformer that converts hydrocarbons such as diesel fuel into hydrogen gas.

In addition, in contrast to conventional mufflers, the acoustic characteristics the mufflers of the preferred embodiments may be manually or automatically varied or adapted to achieve a desired acoustic effect, thus enabling the mufflers of the preferred embodiment to be tuned. If automatic adaptation is provided-for, the tuning may be carried out in real time in response to engine load and speed.

According to a further variation, the muffler of the preferred embodiments may include baffles or partitions coated with a catalyst to expedite heat transfer and reduce emissions.

2. Description of Related Art a. Flow-Through Mufflers

Noise silencing mufflers are well-known and take on a variety of forms. The most commonly-used type incorporates a sound absorbing material through which exhaust gases are passed. However, the material through which the gases are passed inherently cause back-pressure to be exerted on the engine. Excess back-pressure increases fuel consumption and decreases engine performance.

To decrease back-pressure on the engine and increase efficiency, it is also known to provide mufflers which incorporate circuitous passages that isolate and attenuate, or cancel, sound waves generated by the exhaust stream, rather than relying on sound absorbing materials. In order to minimize turbulence or eddy currents that increase back pressure and noise, many of the circuitous passage designs divide the incoming exhaust stream into multiple paths, and converge the paths at the outlet.

Examples of flow-through mufflers with circuitous passages are disclosed in U.S. Pat. Nos. 3,786,896; 4,809,812; 5,444,197; 6,364,054; and 6,296,074. Of particular interest are U.S. Pat. No. 6,364,054, which discloses a muffler having expansion chambers and reduced openings that decrease sound volume by conversion of a part of the sound energy to heat energy, and which modify the frequency of sound passing through the muffler to provide tuning. Also of particular interest are U.S. Pat. No. 6,089,347, in which various dividers and partitions are arranged so that sound is attenuated in the spaces between the partitions as exhaust gases are directed past the outward ends of the partitions, the lengths of the spaces between the partitions being chosen to tune the muffler to affect selected frequencies, and U.S. Pat. No. 6,296,074, which discloses a sound cancelling muffler, in which the exhaust stream is separated into two different passages having different lengths so that at the point of conversion, the acoustic waves generated by the exhaust gases are out of phase and actually cancel as opposed to merely being attenuated.

In its broadest form, the present invention combines the principle of heat conversion taught by the above-cited U.S. Pat. No. 6,364,054 and the sound attenuation or cancellation principles of U.S. Pat. No. 6,089,347, U.S. Pat. No. 6,296,074 and other prior patents in a way that offers a substantially simplified construction, and that enables increased versatility, including the ability to utilize the muffler for electricity generation and even emissions reduction, and to enable the muffler to be tuned to compensate for the different frequencies generated at different engine speeds and loads.

b. Thermo-Electric Heat-to-Electricity Conversion

Instead of simply dissipating the heat carried away by the thermally-conductive baffles or partitions of the flow through muffler of the preferred embodiments, one aspect of the present invention is to utilize the heat for thermoelectric generation. While it is known to convert waste heat into electricity using thermo-electric generation, the present invention combines the thermo-electric generation with noise reduction by utilizing the energy captured by heat-conductive baffles or partitions in the muffler. Since 80% or more of energy consumed by the engine is lost through the exhaust system, this can result in substantial energy savings, while at the same time greatly increasing muffler efficiency without increasing back pressure. By way of background, thermo-electric generation systems for vehicles are described in U.S. patent application Ser. Nos. 11/056,233 and 11/056,237, both filed on Mar. 2, 2005, and in U.S. Pat. Nos. 6,605,773; 6,172,427; 5,968,456; 5,753,383; 5,625,245; 4,753,682; and 4,673,863; and 4,161,657.

c. Tunability

Finally, according to another aspect of the present invention, the attenuation frequencies of the muffler may not only be pre-selected, but the frequency may actually be adjusted during use. A muffler that is "tuned" to attenuate frequencies at racing speeds might have little effect when the race car is pulling into a garage in the middle of the night. The tuning is achieved by using the principle of sound cancellation, but with adjustable divergent paths. No prior muffler has this capability.

SUMMARY OF THE INVENTION

It is a first objective of the invention to provide a muffler that reduces engine fuel consumption.

It is a second objection of the invention to provide a muffler that reduces engine load while providing adequate sound attenuation, and that is simple to construct.

It is a third objective of the invention to provide a muffler than serves as a heat extractor for a thermo-electric generator.

It is a fourth objective of the invention to provide a muffler having improved sound attenuation or cancellation characteristics, and that may easily be adapted for a particular acoustic profile.

It is a fifth objective of the invention to provide a muffler that may be tuned to cancel sound at a range of engine speeds and loads.

It is a sixth objective of the invention to provide a muffler that is simple in construction and that may be easily adapted to meet any or all of the above objectives.

These objectives are achieved, in accordance with the principles of various preferred embodiments of the invention, by providing a flow-through muffler made up of a main body and a lid from which extend a plurality of heat conducting baffles, partitions, or walls that together define passages arranged to form acoustic waveguides, attenuators, and/or cancellation chambers, the passages extending from an input to an output of the muffler, the baffles, partitions, or walls increasing a surface area exposed to the exhaust gases to facilitate extraction of heat from the exhaust flow while attenuating or canceling the resulting sound pressure waves. The housing may be cast or made of sheet metal, and may include a wide variety of internal configurations.

According to additional preferred embodiments of the invention, the muffler includes an exhaust gas chamber having a heat sink that forms a plurality of passages for attenuation and/or cancellation of sound and increases a surface area of the heat sink exposed to the exhaust gases, the heat sink conducting heat to a surface of the muffler that is outside the exhaust gas chamber, the muffler having mounted thereon a cooling arrangement, and thermoelectric generator elements connected across the heat differential between the cooling arrangement and the heat sink.

According to still further preferred embodiments of the invention, by providing a flow through muffler having at least two acoustic paths having different lengths between divergence and convergence, acoustic waves generated by the exhaust stream may be canceled. The difference between the lengths of the two paths may then be made variable, or paths of different lengths may be selectively closed off, according to a desired attenuation characteristic and/or in response to engine speed and load, resulting in a "tunable" muffler. Variation in the path lengths may be manual or automatic, in the former case permitting the user to increase or reduce the noise made by the vehicle according to preference, and in the latter case also permitting the muffler to operate at peak efficiency over a wide range of engine speeds and loads. Many racing vehicles, for example, have mufflers adapted to high speed operation that are ineffective at low speeds. The present invention solves this problem, enabling noise reduction both during and after a race.

Numerous mechanisms may be used to vary acoustic path lengths in order to "tune" the flow-through mufflers of the invention, including telescoping mechanisms, linearly movable walls, pivotal flow diverters or valves, and so forth. In general, the path length difference in feet that is required to achieve sound cancellation (i.e., a path length difference of half a wavelength) is 1875 multiplied by the number of cylinders, and divided by the speed of the engine (RPM) and the number of revolutions per firing of each cylinder, or 7500/RPM for an eight cylinder engine with two revolutions between firings.

Those skilled in the art will appreciate that the heat sink or tuning capabilities of the invention may be combined with the flow-through muffler configurations of any of the preferred embodiments, that the heat sink may be also be used in connection with non-cancelling and/or non-tunable muffler configurations, and further that any of the illustrated flow-through muffler arrangements may be utilized without the inclusion of a thermoelectric generator. In addition, the internal surfaces of the muffler of any of the preferred embodiments may be coated with a catalyst to provide a combination muffler and catalytic converter, without or without an additional thermoelectric generator, and devices other than or in addition to thermo-electric generators, such as a hydrocarbon reformer, may further be added to utilize the heat extracted from the exhaust stream.

Finally, those skilled in the art will appreciate that the invention is not limited to use on vehicles, or even to internal combustion engines, but rather may be applied to any system that generates an exhaust stream or flow of hot gases, including smoke stacks or steam generators.

DETAILED DESCRIPTION OF THE PREFERRED EMBODIMENTS

Figure 1:
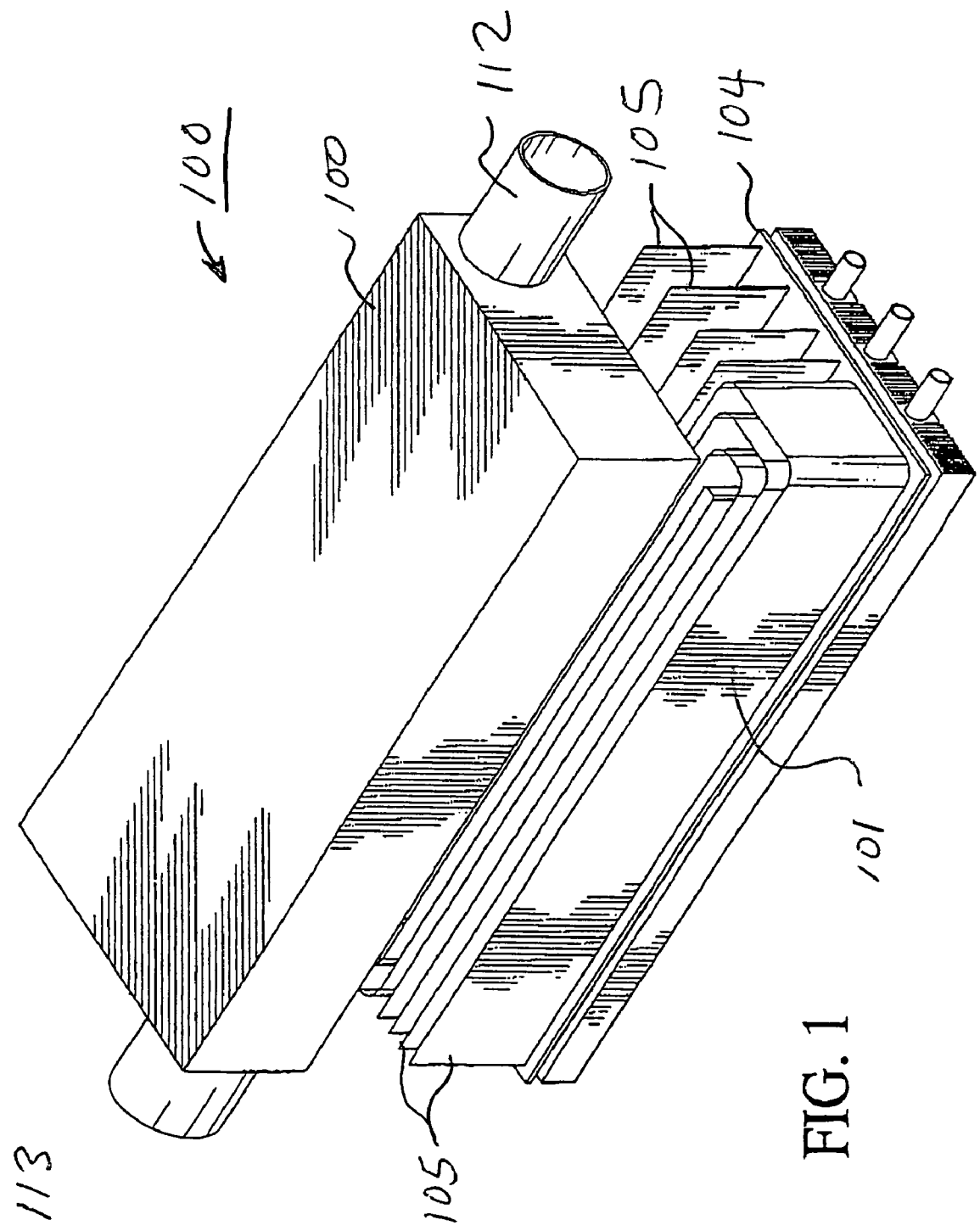
FIG. 1 is an exploded isometric view of a flow-through muffler constructed in accordance with the principles of a preferred embodiment of the invention.
Figure 2:
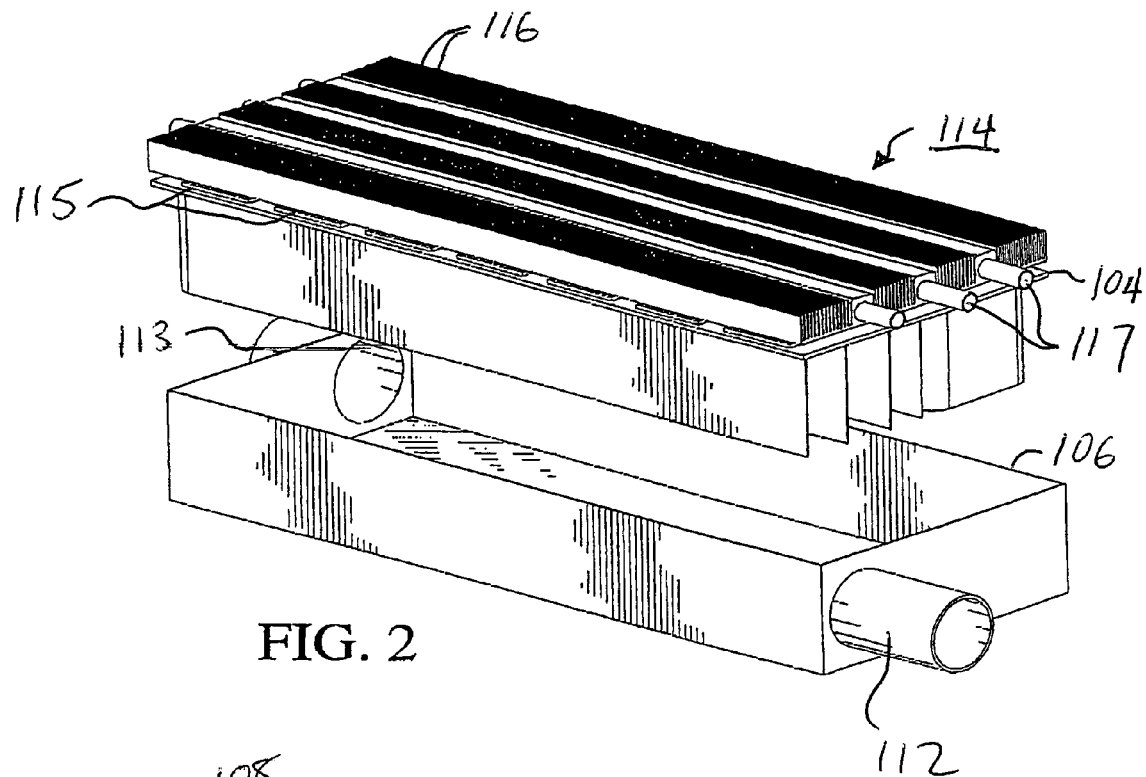
FIG. 2 is an exploded isometric view of an opposite side of the muffler of FIG. 1.
Figure 3:
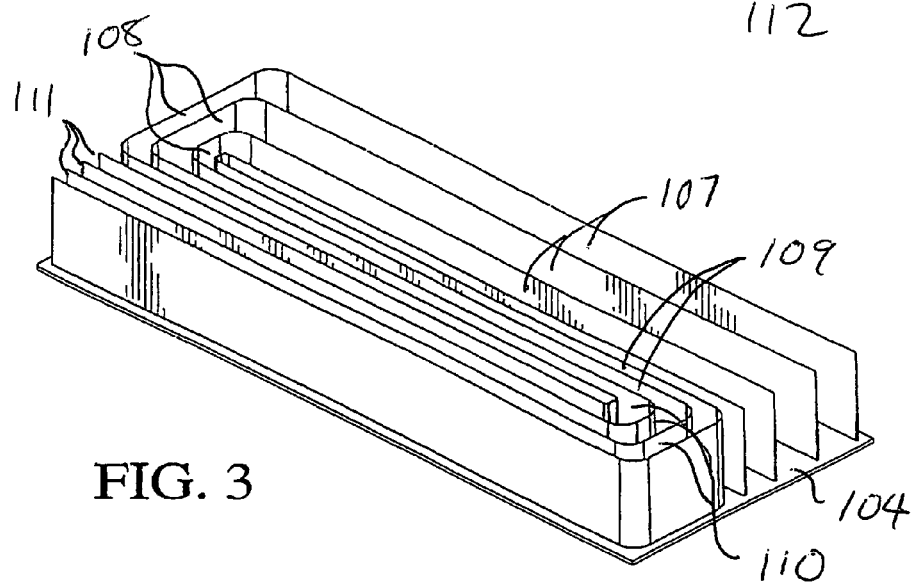
FIG. 3 is an isometric view of a baffle arrangement for the muffler of FIG. 2.

FIGS. 1-3 illustrate a flow-through muffler 100 constructed in accordance with the principles of a first preferred embodiment of the invention. Muffler 101 includes a first housing section 102 and a second housing section 103 which fit together to form an airtight container for passage of exhaust gases. Housing section 103 includes a cover 104 from which extend a plurality of walls 105. Cover 104 may be secured to the housing section 102 by welding, bolting, or any other suitable attachment means.

Partitions or baffles 105 are arranged to fit within housing section 102 when cover 104 is secured to the rim 106 of housing section 102 to thereby form a plurality of flow-through passages of gradually increasing width to decelerate exhaust gases, and having an s-shaped configuration consisting of straight exit sections 107, intermediate sections 108 extending transversely to straight sections 107, second straight sections 109 parallel to straight sections 107, second intermediate sections 110 parallel to first intermediate sections 108, and inlet passages 111 parallel to straight sections 107 and 109. Because of the s-shaped configuration, the passages have lengths that are longer than the length of the housing.

Housing section 102 includes an inlet pipe 112 and an outlet pipe 113 arranged to be secured to the exhaust system of a internal combustion engine by muffler attachment fixtures that may be the same as those used to connect a conventional muffler to an exhaust system. The preferred muffler 1 may be fitted into the exhaust system of a vehicle, but is not limited to vehicular applications. In addition, surfaces in the muffler may be coated with a catalyst so that the muffler also serves as a catalytic converter, the catalyst having the additional effect of enhancing heat transfer to the heat-conducting baffles or partitions.

Housing section 103 is preferably made of a heat conductive material, and may be cast, formed of a sheet material, or assembled from a combination of cast and non-cast parts. The greater the number of passages, the greater the area exposed to the exhaust gases and available to transfer heat. In general, formation of the housing section 103 from sheets is less expensive than casting, particularly when the material is a heat conductive metal. Housing 102 may be a conventional parallelepiped-shaped housing and, if a thermo-electric generator is included on only one side, preferably is made of a material having relatively low heat conductivity. If a thermo-electric generator is omitted and a cooling system is included to carry away or radiate heat captured by the heat sink, then housing section 102 may be made of a heat conductive material.

The heat sink formed by the housing section 102 is illustrated as being connected to one or more thermoelectric generating units 115 having one surface connected to cover 104 and a second surface connected to a heat-exchanging device 114, which in the illustrated embodiment includes a plurality of fins 110 in thermal contact with cooling pipes 111. Cooling pipes 111 may be supplied with air, water, or any other coolant.

Thermoelectric generators are described in U.S. Pat. Nos. 6,605,773; 6,172,427; 5,625,245; 4,753,682; and 4,673,863, cited above, although the invention is not to be limited to a particular type of thermoelectric generator. Current thermoelectric generator configurations are capable of generating upwards of 250 W when connected to a typical vehicle exhaust system.

Those skilled in the art will appreciate that the shape of the passages 107-111 formed by walls 105 may be varied in numerous ways to achieve desired acoustic effects. For example, the acoustic waves generated by the passage of exhaust gases may be modeled by commercially available software that determines the effects of the walls on exhaust streams of various anticipated velocities and volumes, in order to determine the exact dimensions and configuration necessary to obtain an optimal acoustic effect. As a result, the muffler may be adapted to have desired characteristics by simply varying the configuration of the partitions or baffles that forms the passages.

Figure 4:
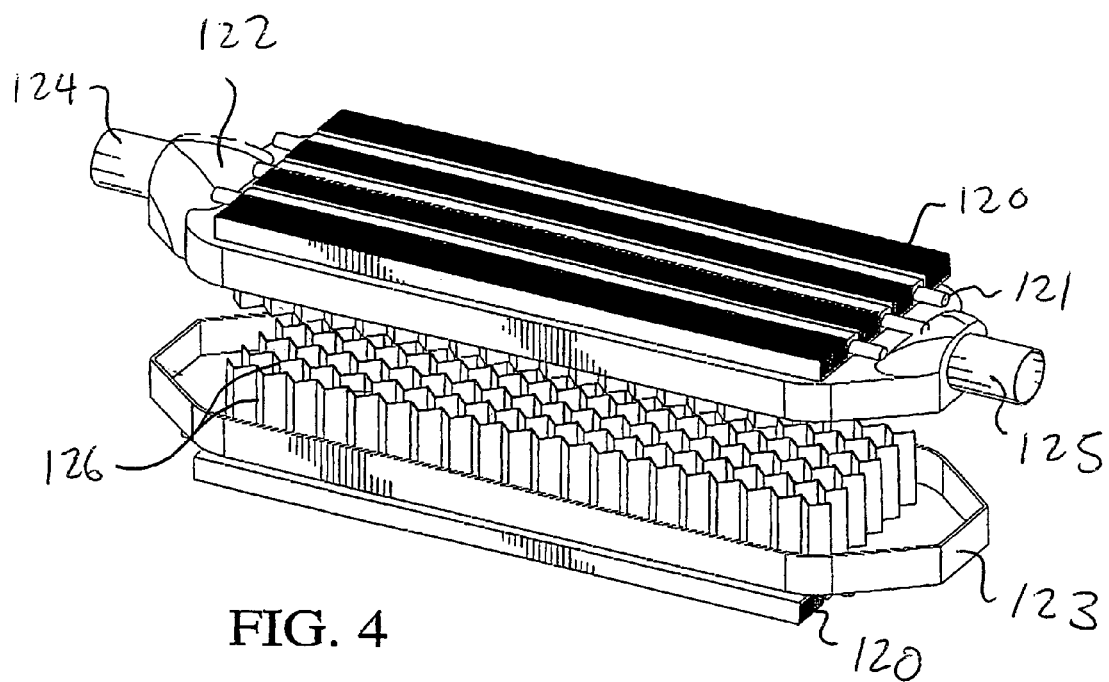
FIG. 4 is an exploded isometric view of a flow-through muffler constructed in accordance with the principles of a second preferred embodiment of the invention.

FIG. 4 shows a variation of the muffler of FIGS. 1-3 in which heat exchange units made up of fins 120 and cooling pipes 121 are situated on opposite sides of the muffler housing, and in particular on principal surfaces of respective housing sections 122 and 123, which respectively include an inlet 124 and outlet 125, and interior walls 126. In this example, the passages formed by the interior walls 126 of the heat sink are symmetrical, and the walls extend substantially all the way from the inlet end to the outlet end of the muffler, and have a zig-zag shape to deaden or attenuate sound waves generated by the exhaust stream. In general, the illustrated dual heat sink configuration may be used with any of the interior wall arrangement illustrated herein, and the zig-zag shape may be used with a single heat sink, with or without the inclusion of thermo-electric generators.

Figure 5:
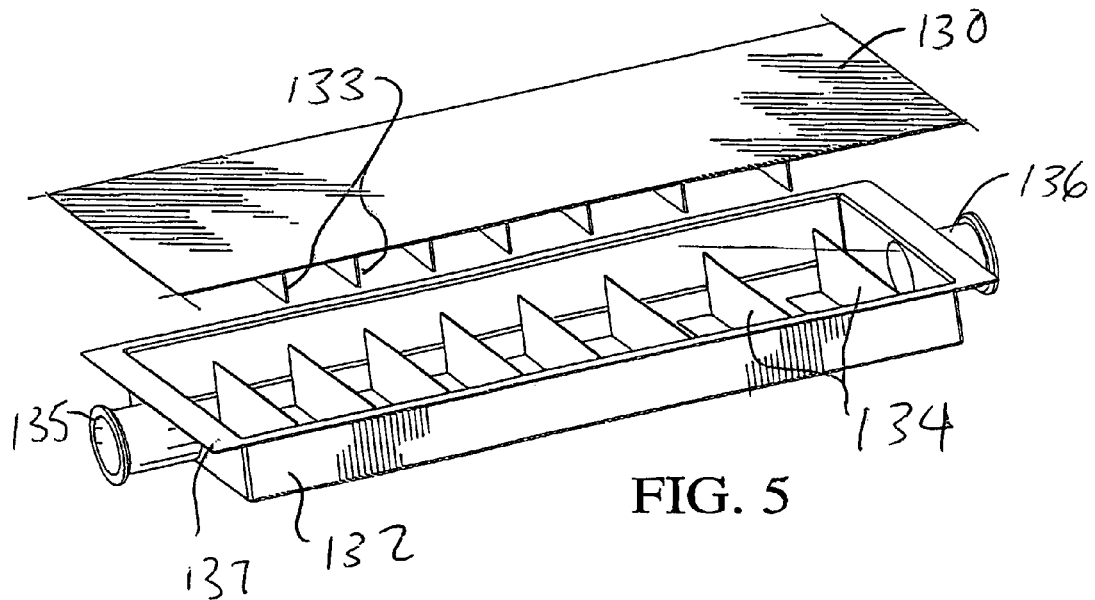
FIGS. 5 and 6 are exploded isometric views, taken from different angles, of a flow-through muffler constructed in accordance with the principles of a third preferred embodiment of the invention.
Figure 6:
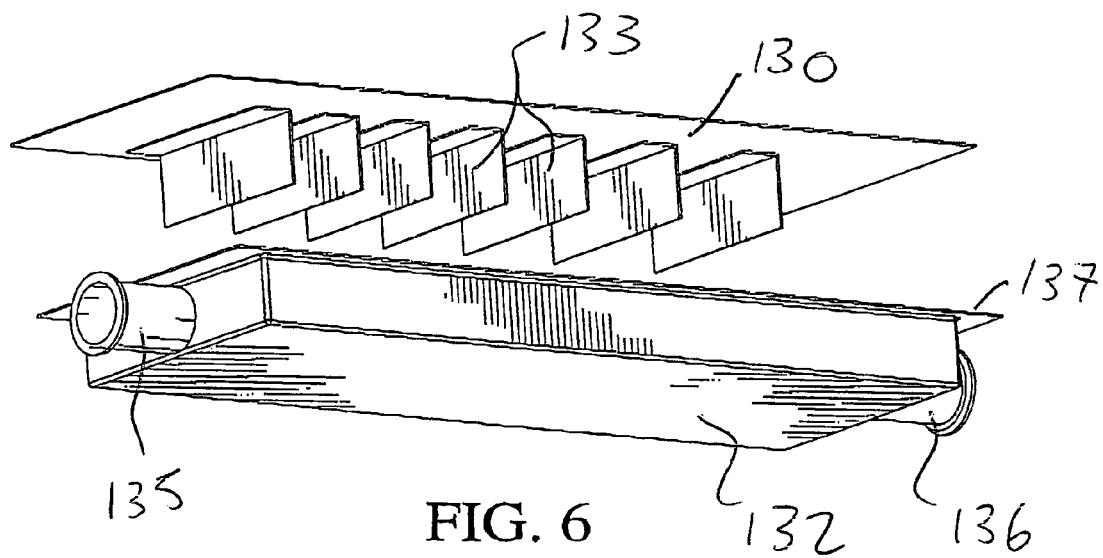

FIGS. 5 and 6 show an embodiment of a muffler having an upper housing or lid 130, lower housing 131, and internal walls 132 and 133 respectively extending from the upper and lower housings 130 and 131 and staggered or offset to form a zigzagged exhaust stream passage between inlet 134 and outlet 135. Housings 130,131 and walls 132,133 may each be formed of sheet metal to provide an especially inexpensive construction, with walls 133 optionally having an L-shape to facilitate attachment to the respective housings by soldering, welding, or any other suitable heat-conducting attachment means. Lower housing 132 may include a flange to facilitate attachment of the upper housing 133. External heat sinks may be provided to dissipate heat, and thermo-electric generators corresponding to those illustrated in FIGS. 1-4 may also be added.

Figure 7:
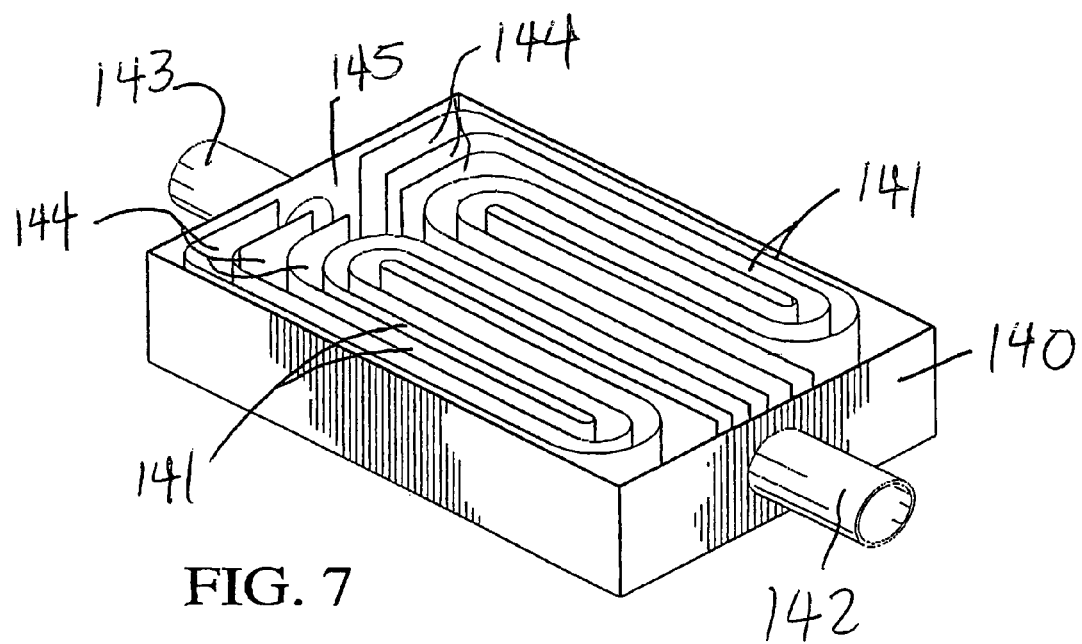
FIGS. 7-12 are respective isometric views of flow-through mufflers constructed in accordance with the principles of fourth through ninth preferred embodiments of the invention.

FIG. 7 shows a variation of the muffler lower housing of FIGS. 1-3, in which the lower housing 140 is provided with two sets of mirror symmetric passages 141, the passages having a generally s-shape and preferably increasing in width between the inlet 142 and outlet 143. However, instead of leading directly to the output, the muffler of this embodiment includes additional transverse exit passages 144 which direct the exhaust stream towards a chamber 145 where the exhaust streams come together before exiting through outlet 143. The lengths of the passages may be chosen such that sound waves that exit the passages are 180° out of phase and therefore cancel. The center passage will reduce a pressure drop if open but can be closed as well.

Figure 8:
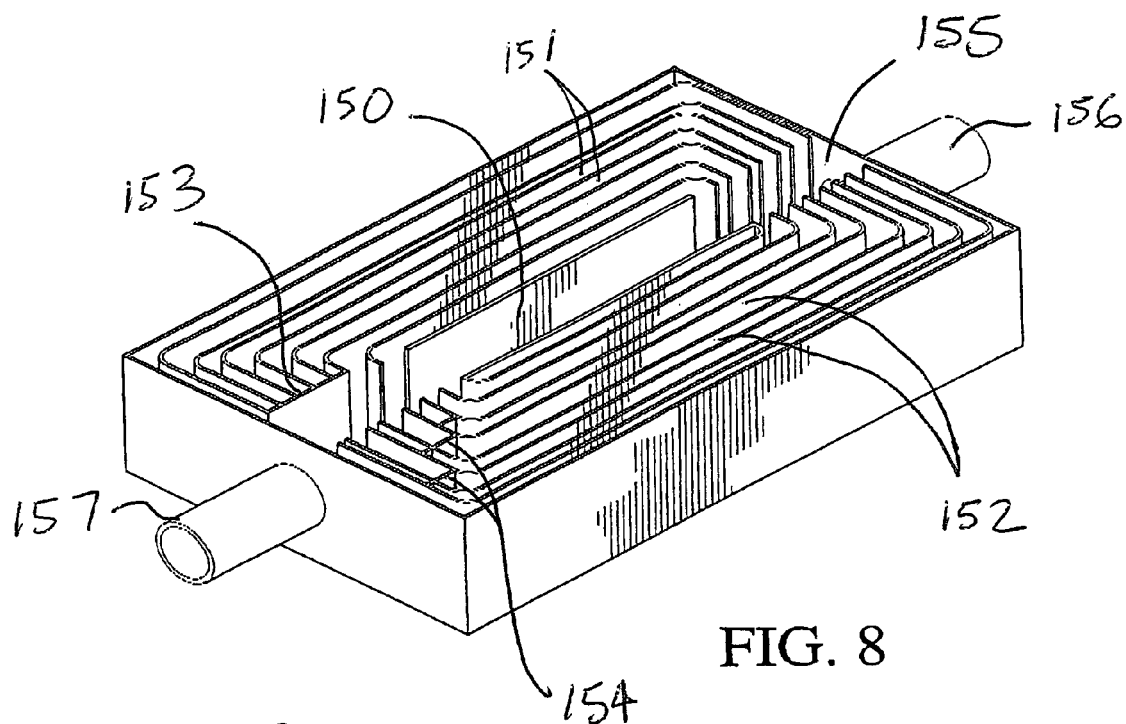

FIG. 8 shows a variation of the embodiment of FIG. 7 in which the exhaust stream is directed straight through a middle passage 150 extending between inlet 156 and outlet 157, and two sets of side passages 151 and 152 are closed to conduct acoustic pressure waves. The passages terminate in walls 153 and 154 to cause variations in the lengths of the chambers such that waves are reflected with a phase difference that results in at least partial cancellation in the input chamber 155.

Figure 9:
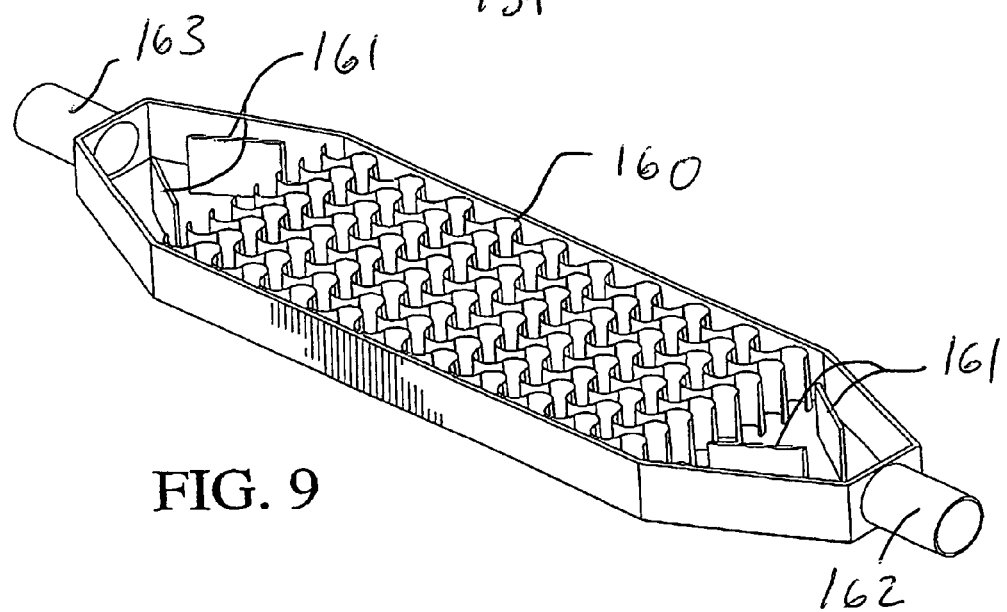
Figure 10:
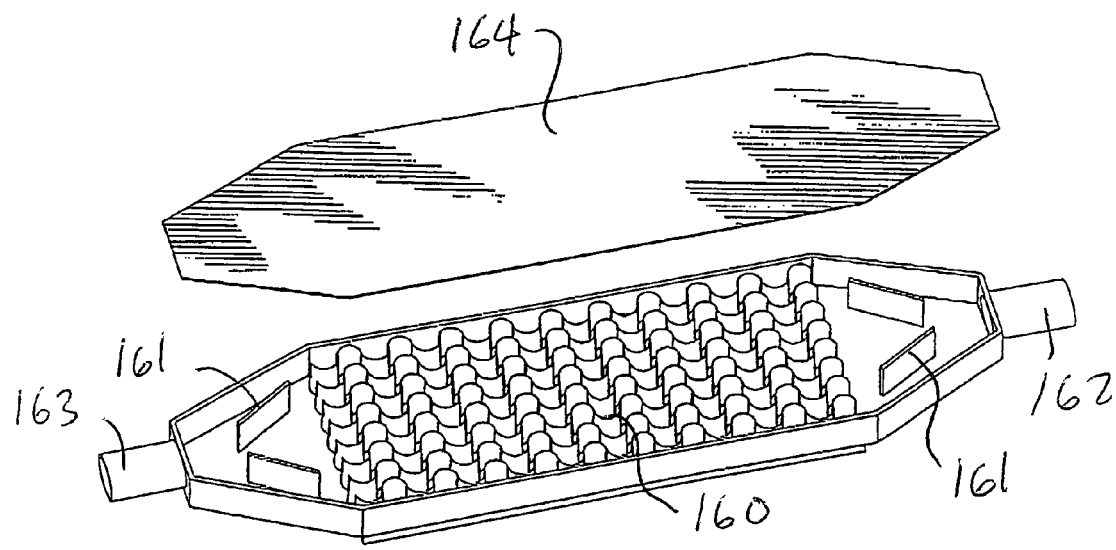

FIGS. 9 and 10 show a variation of the flow-through muffler having curved baffles 160 and additional flow dividers 161. The curved baffles form zigzagged passages extending from an inlet end to an outlet end of the muffler housing in a manner similar to that illustrated in FIG. 4. The flow dividers 161 break up the exhaust flow from inlet 162 and spread it out evenly, and direct outlet flow to the outlet 163. FIG. 10 illustrates the lid 164 included in the muffler of this embodiment, which may further include a heat exchanger and/or thermoelectric generators as described above.

Figure 11:
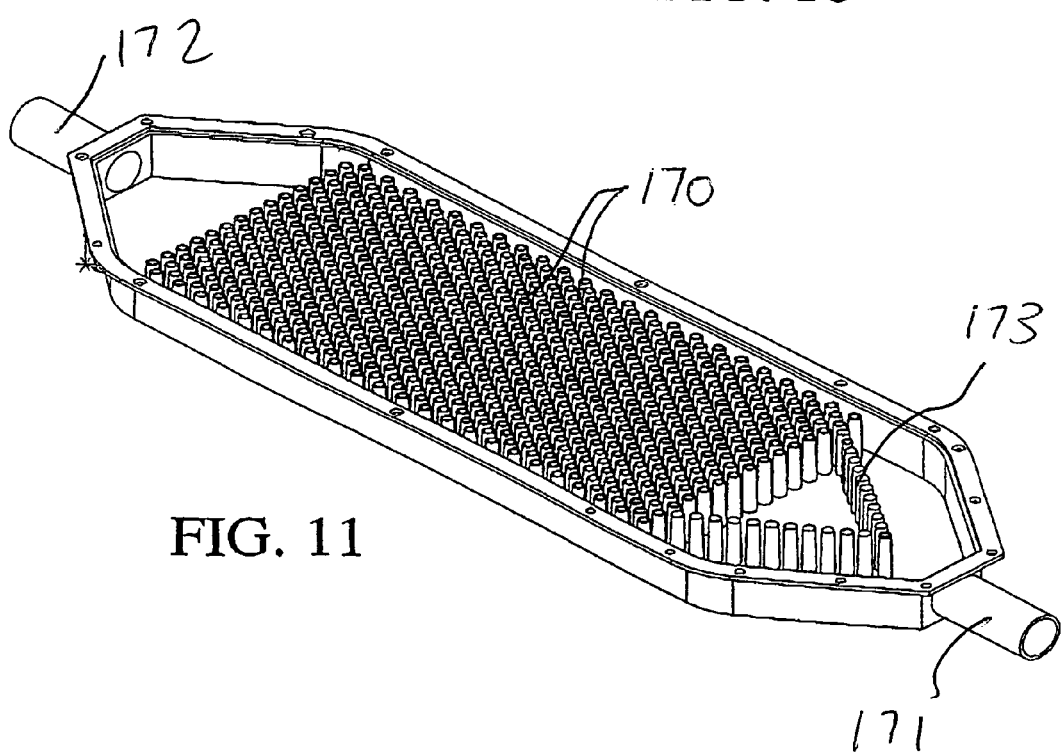

FIG. 11 shows a variation of the embodiment of FIGS. 9 and 10 in which upright tubes 170 are arranged to break up the exhaust flow and conduct heat to the exterior of the muffler housing as the exhaust flows from the inlet 171 to the outlet 172. In this embodiment, tubes on the inlet side are arranged to form a v-shaped aerator or flow divider 173 to help evenly distribute exhaust flow between the passages formed by tubes 170. By using tubes, the surface area is increased for optimal heat dissipation, although the flow-rate is lower than with straight passages, and thus this embodiment is more suitable for furnace or industrial exhaust systems than for vehicles.

Figure 12:
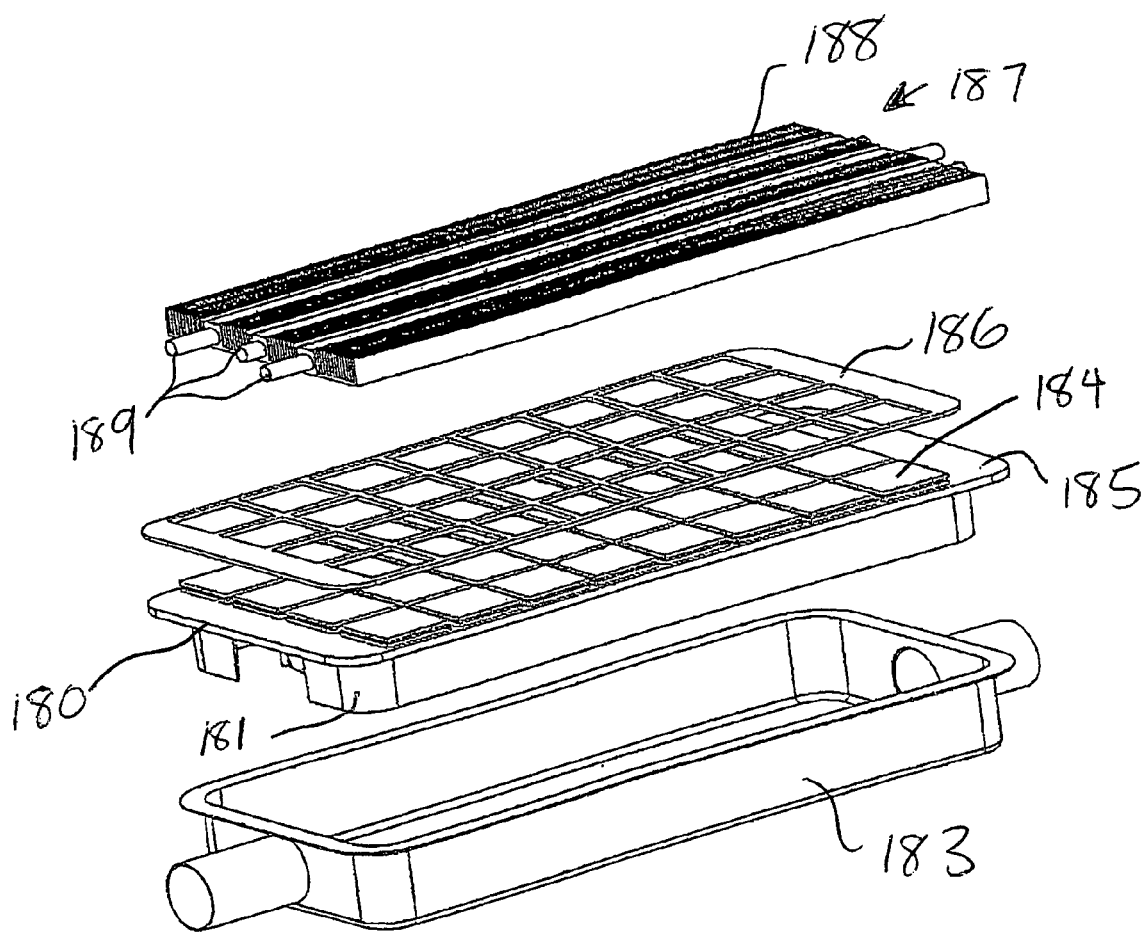

FIG. 12 shows details of the construction of the heat exchanger, which may be used in connection with any of the embodiments illustrated in FIGS. 1-11. The upper housing 180 of the flow-through muffler includes a plurality of heat conducting walls 181. Walls 181 may have any of the configurations illustrated in FIGS. 1-11, or any other sound attenuating flow-through configuration for conducting heat to the exterior surface 182. The lower housing 183 may also have any appropriate configuration and may optionally also including heat conducting walls and a heat-exchanging surface (not shown). Thermo-electric units 184 are in contact with the heat-exchanging surface 185 of the upper housing, and are surrounded by an insulator 186 to ensure a thermal differential across the thermoelectric units 184. The heat exchanger 187 includes radiating fins 188 and coolant pipes 189, and is in contact with a second surface of the thermoelectric units 184.

The electricity generated by the thermoelectric generators may be used for a variety of purposes, including generation of hydrogen by electrolysis, operation of vehicle accessories, or even to drive a thermoelectric cooler to cool engine intake area, which will be helpful in diesel turbo-charged engines to prevent pre-ignition of hot gases generated by a turbo charger.

According to another aspect of the present invention, the flow-through mufflers of FIGS. 1-12 may be modified to be manually or automatically tuneable, again by means of various labyrinthine passage arrangements for attenuating or cancelling sound waves generated by the exhaust flow as it passes through the muffler.

Figure 13:
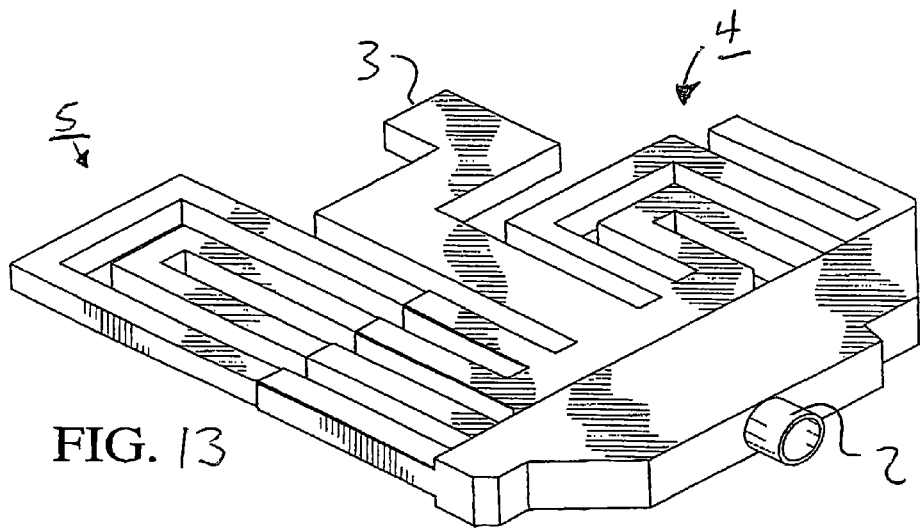
FIG. 13 is an isometric view of a tunable muffler constructed in accordance with the principles of a tenth preferred embodiment of the invention.
Figure 14:
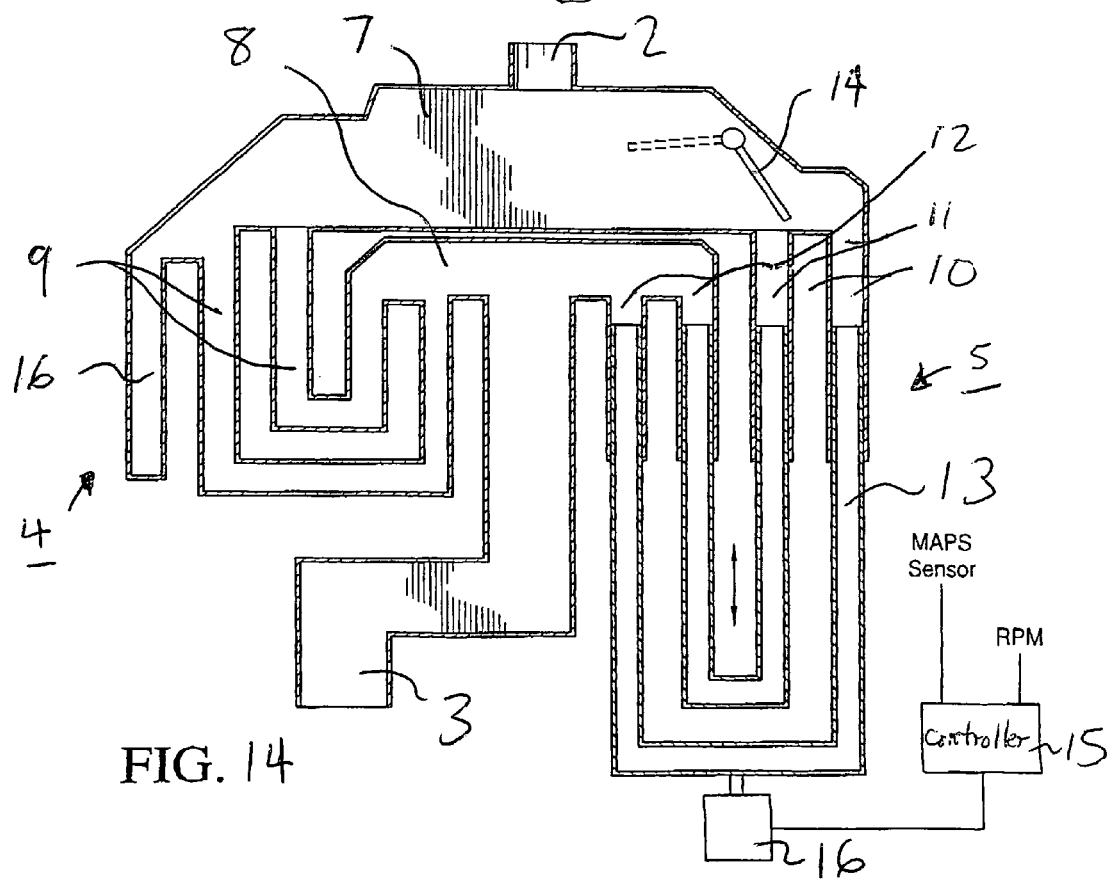
FIG. 14 is a cross-sectional top view of the tunable muffler of FIG. 13.

FIGS. 13 and 14 show a tunable sound cancellation muffler 1 having an intake 2, an output 3, and two labyrinthian sections 4 and 5. Sections 4 and 5 each includes a plurality of exhaust passages through which exhaust gases flow between an input chamber 7 and a convergence chamber 8. One set of passages 9 is shorter than a second set of passages 10 such that acoustic waves generated by the exhaust gases arrive at the convergence chamber with a phase difference that depends on the frequency of the waves. The frequency of the waves in turn depends on the speed of the engine and the load.

According to the embodiment illustrated in FIGS. 13 and 14, passages 10 are formed by fixed tubes 11 in communication with and extending from the input chamber 7, fixed tubes 12 in communication with and extending from the convergence chamber 8, and a movable section 13 arranged to slide in and out of the tubes 11 and 12 to provide a telescoping effect similar to the slide of a trombone, thereby varying the length of the passages 10.

It will be appreciated that alternative means of varying the passages may also be employed, such as a system of gates that divert the exhaust gases into passages of different lengths, or that close and open selected passages. One such flow-diverting gate 14 is included in the embodiment of FIG. 14.

By adjusting the lengths of the passages, for example, by moving the tubes of movable section 13 in and out relative to tubes 11 and 12, the phase of the acoustic waves generated by exhaust gases in passages 10 can be adjusted so that the acoustic waves in passages 10 are exactly 180° out of phase relative to the acoustic waves arriving in the convergence chamber 8 from passages 9, thereby canceling the waves.

Since the phase of the wave arriving in the convergence chamber 8 depends on the frequency of the waves, which in turn varies with engine speed and load, a controller 15 may be provided to calculate or determine appropriate positions for section 13 based on input of engine RPM and MAPS sensor data, the latter indicating the load on the engine, and control a motor 16 accordingly. The determination may be based on predetermined phase profiles, and implemented in the form of look-up tables.

Adjustment may also be carried out manually by an operator of a vehicle, based on perceived and/or desired sound levels, either by operator control of the motor 16, or by a mechanical adjustment (not shown) in addition to or in place of the motor. For example, if manual adjustment means are provided to control the motor, a user could override automatic sound minimization in order to decrease sound attenuation or cancellation in certain situations.

In addition to adjustment based on engine data, those skilled in the art will appreciate that adjustment could be based directly on sound data collected by a microphone, using an open loop servo to move adjust the path lengths until a desired sound is achieved.

In the illustrated embodiment, multiple passages are included. While these passages are indicated as generally parallel, there is no limitation on the configuration of the passages, which may be designed to cancel a range of frequencies or harmonics. In addition, the embodiment of FIGS. 13 and 14 includes an optional flow diverter 14 for diverting exhaust flow to selected passages, and reflection passage 16 which is connected to the input chamber 7 but not to the convergence chamber 8. Passage 16 does not carry any exhaust gases, but does reflect acoustic waves to vary the sound cancellation characteristics of the muffler. The muffler may of course included one or more such reflection passages, or the reflection passage may be omitted.

The path lengths necessary to achieve sound cancellation in this embodiment of the invention may be calculated as follows (similar calculations may be used for the other sound cancelling embodiments described below): The frequency of sound from the engine depends on the number of cylinders and engine speed. Assuming eight cylinders and two revolutions between firing for each cylinder, the sound frequency F (Hz)=4 Cylinders*RPM/60=RPM/15. For path length L, the path length difference required to achieve cancellation is one-half of the wavelength corresponding to the sound frequency. For sound traveling at speed C of approximately 1000 f/sec:

$$L = C/F = 0.5*1000/(RPM/15) = 500*15/RPM = 7500/RPM.$$

For telescoping paths, the path length difference is twice the slide length difference, so the slide length difference is D=3700/RPM. If the maximum slide length difference is 0.6 ft, then RPM=approximately 5000, which is high. If the engine is to deliver power in the 1400 to 3000 RPM range, then length differences must equal:

At 1400: L=7500/1400=5.3 ft;

At 3000: L=7500/3000=2.5 ft.

Therefore, the difference in path lengths of the telescoping structure should be adjustable from 2.5 to 5.3 ft, which corresponds to a slide length difference of 1.25 to 2.65 ft. This is certainly achievable within the footprint of a conventional muffler, although as the length increases, it becomes increasingly desirable to use lower mass linear designs, or pivotal valve or flow diversion arrangements, examples of which (in addition to flow diverter 14 illustrated in FIG. 14) are described below in connection with FIGS. 15-24, or combinations of different types of path length varying or selecting arrangements. Ultimately, the path length difference depends on the power band of the engine, and therefore the path length differences can range from approximately 0.1 ft to 10 ft or more depending on the type of engine. The invention is intended to encompass any means for varying the path length difference, including telescoping arrangements, sliding wall arrangements, and diverter valves for transferring incoming gases to different paths.

Figure 15:
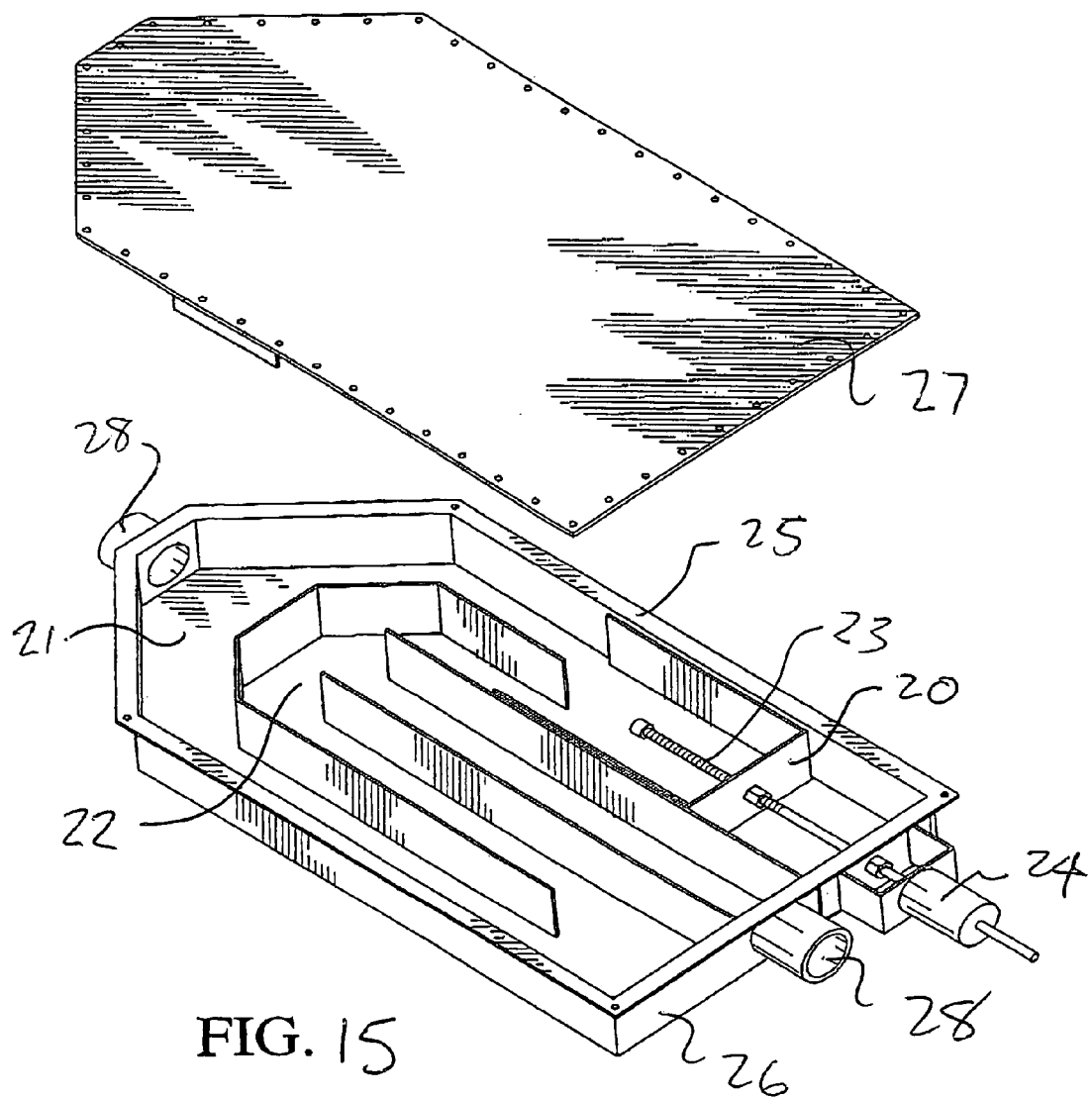
FIGS. 15 and 16 are isometric views, taken from different angles, of a tunable muffler constructed in accordance with the principles of an eleventh preferred embodiment of the invention.
Figure 16:
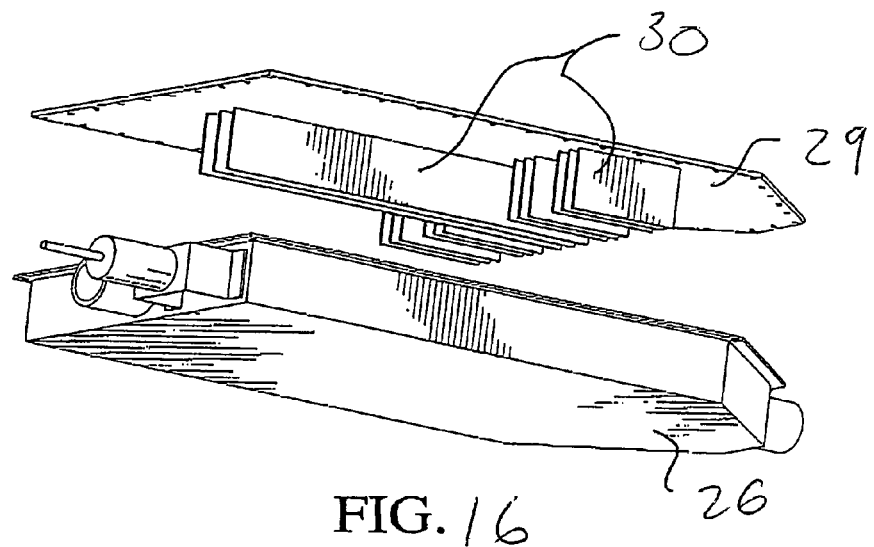
Figure 17:
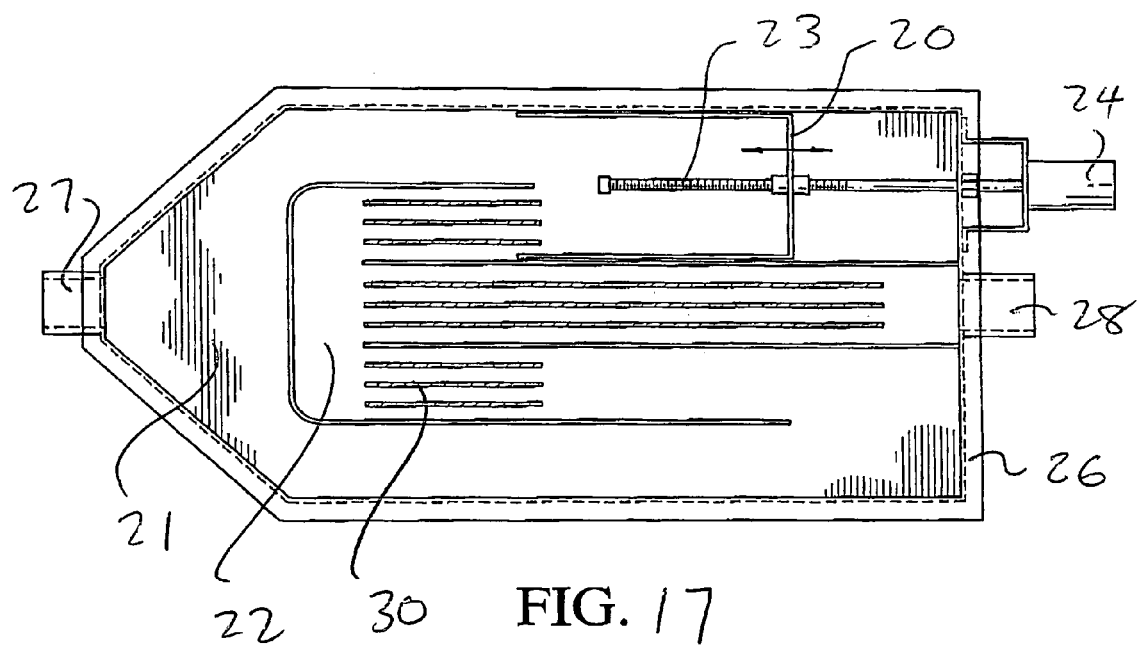
FIG. 17 is a cross-sectional top view of the flow-through muffler of FIGS. 15 and 16.

In the embodiment of FIGS. 15-17, tuning is provided by an adjustable wall 20 of one of the passages, rather than by an entire telescoping housing section. This embodiment provides better flow due to reduced eddy currents, with sound being cancelled in several locations by one or more motors. The motors may be controlled by a closed feedback loop as in the embodiment of FIGS. 12-14. Air flow is divided in chamber 21 and cancellation occurs in convergence chamber 22. Passage-length-defining wall 23 is driven by a motor-driven screw 24 or by any other suitable driving means, such as motor-driven pulleys and belts, linear actuators, or the like, and/or manual adjustment means. The housing 25 of the muffler of this embodiment includes a sheet metal or cast lower sections 26, lid 27, inlet 28, and outlet 29 similar to those of the embodiments of FIGS. 1-12, and therefore may be inexpensively produced despite the reduced back-pressure and tuneability. As can best be seen in FIGS. 16 and 17, the muffler of this embodiment may optionally include additional heat sink baffles 30 to direct sound.

Figure 18:
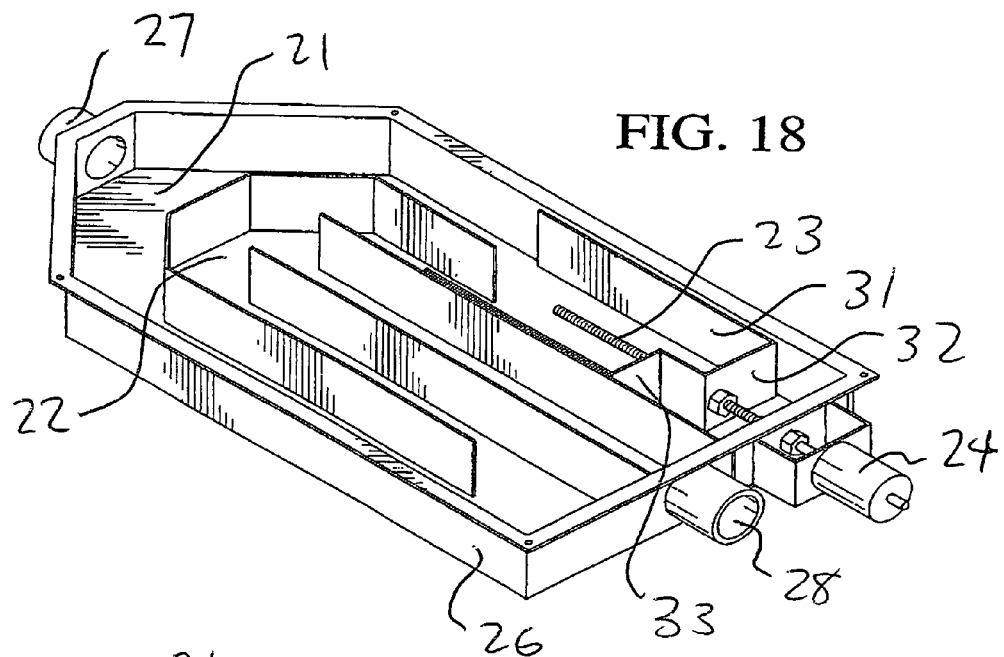
FIGS. 18-21 are isometric views of tunable flow-through mufflers constructed in accordance with the principles of twelfth through fifteenth preferred embodiments of the invention.
Figure 19:
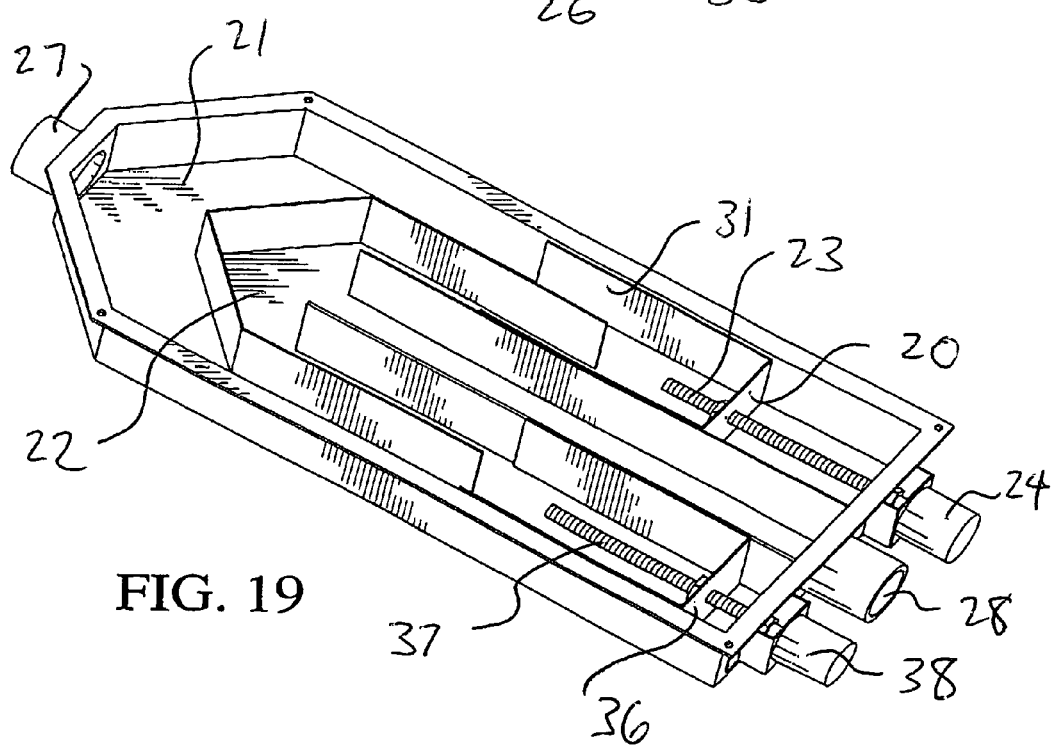
Figure 20:
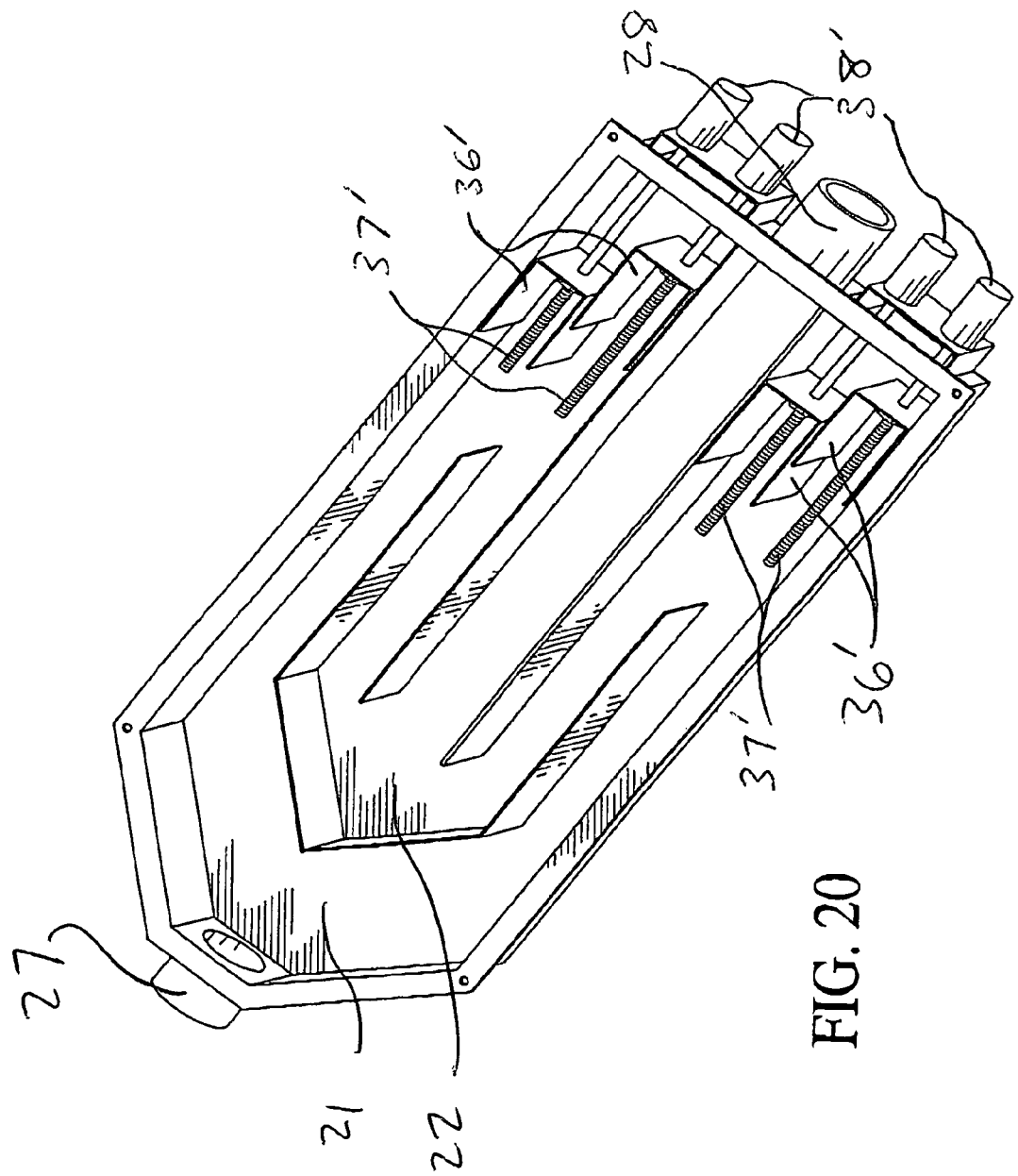

In the variation shown in FIG. 18, a modified tuning member 31 having a stepped shape including walls 32 and 33 is provided to provide two different sound cancelling paths in order to cancel multiple frequencies or harmonics. In the variation illustrated in FIG. 19, a second tuning member 36, screw 37, and motor 38 may be provided, while in the variation illustrated in FIG. 20, four tuning members 36', four screws 37', and motors 38' may be added to increase the precision of frequency adjustments.

Figure 21:
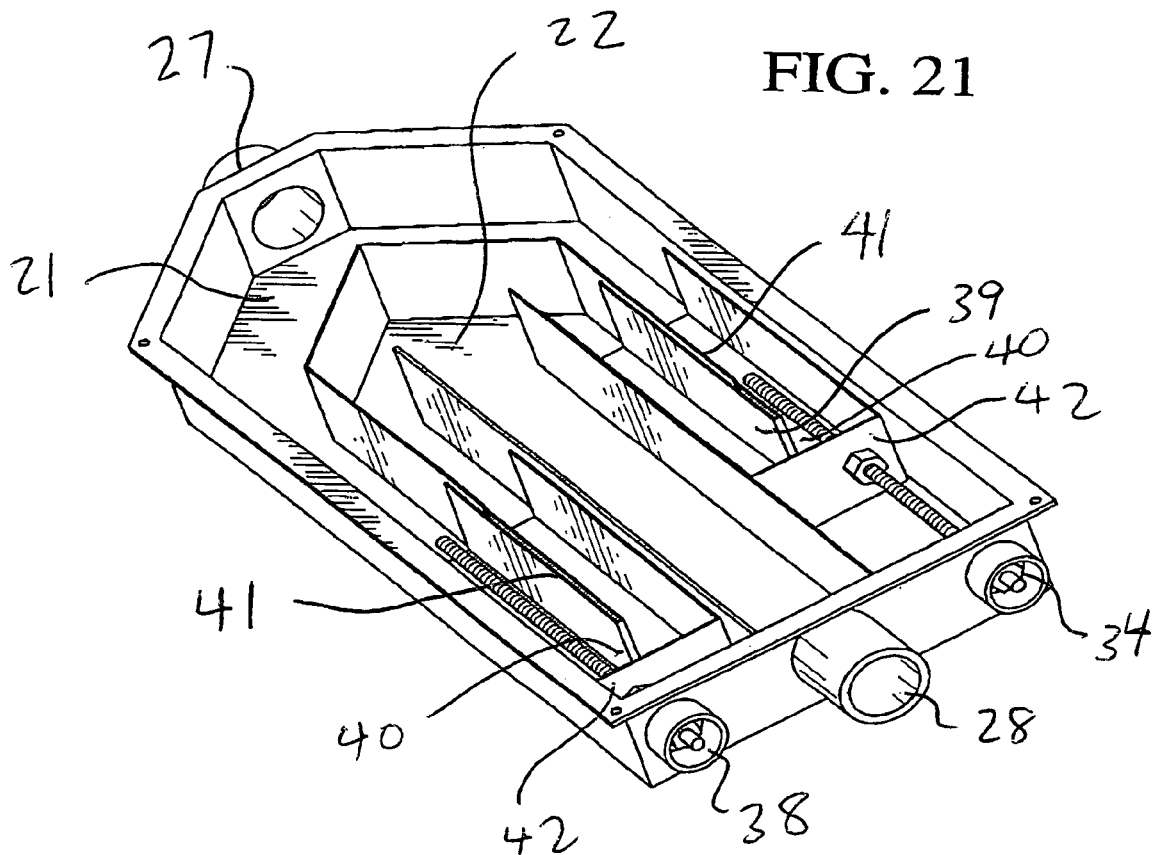
Figure 22:
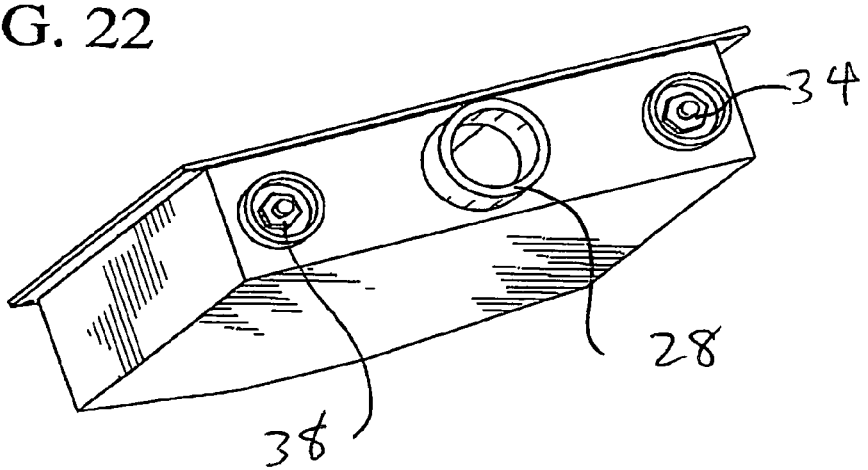
FIG. 22 is an isometric view taken from the lower rear of the flow through muffler of FIG. 21.

In the variation illustrated in FIGS. 21 and 22, on the other hand, the first motor has been replaced by a bolt-adjustable adjustment mechanism 34. Each of the adjustment mechanisms 34 and 38 may be sealed by an end cap (not shown), and a fixed pass-through may be provided by adding a baffle plate 39 that is movable with the tuning members 20 and 36 relative to a fixed baffle plate 41. A fixed cut-out 40 is thereby provided between the end walls 42 of the tuning members and the movable baffle plates 39.

Figure 23:
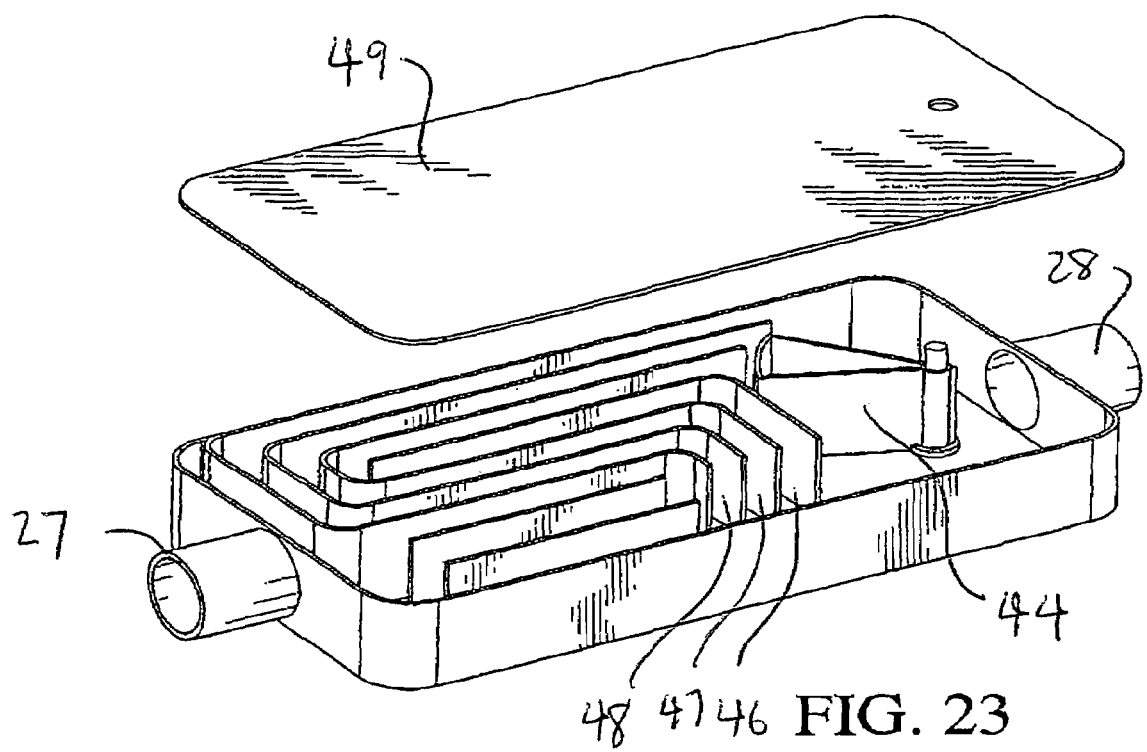
FIG. 23 is an isometric view of a tunable flow-through muffler constructed in accordance with the principles of a sixteenth preferred embodiment of the invention.
Figure 24:
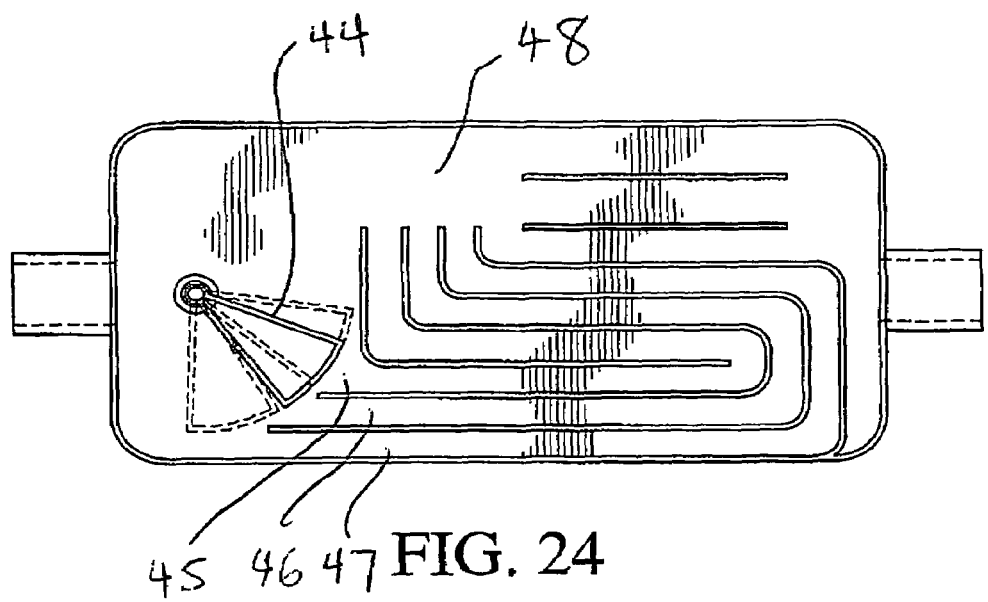
FIG. 24 is a plan view of the base portion of the tunable flow-through muffler of FIG. 23.

FIGS. 23 and 24 show an alternative approach to tuning, in which the linear tuning mechanism is replaced by a diverter in the form of a pivotal member 44 having a generally wedge shape that is rotated by a motor (not shown) to selectively block and unblock passages 45-47 of different lengths in order to vary the frequency or frequencies of sound waves canceled in the outlet sound cancellation chamber 48. This embodiment includes inlets 27 and 28 and a lid 49.

This embodiment of the invention has the advantage that tuning can be achieved more rapidly than is possible with a screw mechanism. Those skilled in the art will appreciate, however, that mechanisms other than the illustrated screw or pivot mechanisms may be employed to vary the length of sound cancelling passages, or to select passages of different lengths, including electromagnetic linear actuators, solenoids for achieving linear or pivotal movements direct drive rotary or stepper motors, belt or gear drive mechanisms, and so forth.

Figure 25:
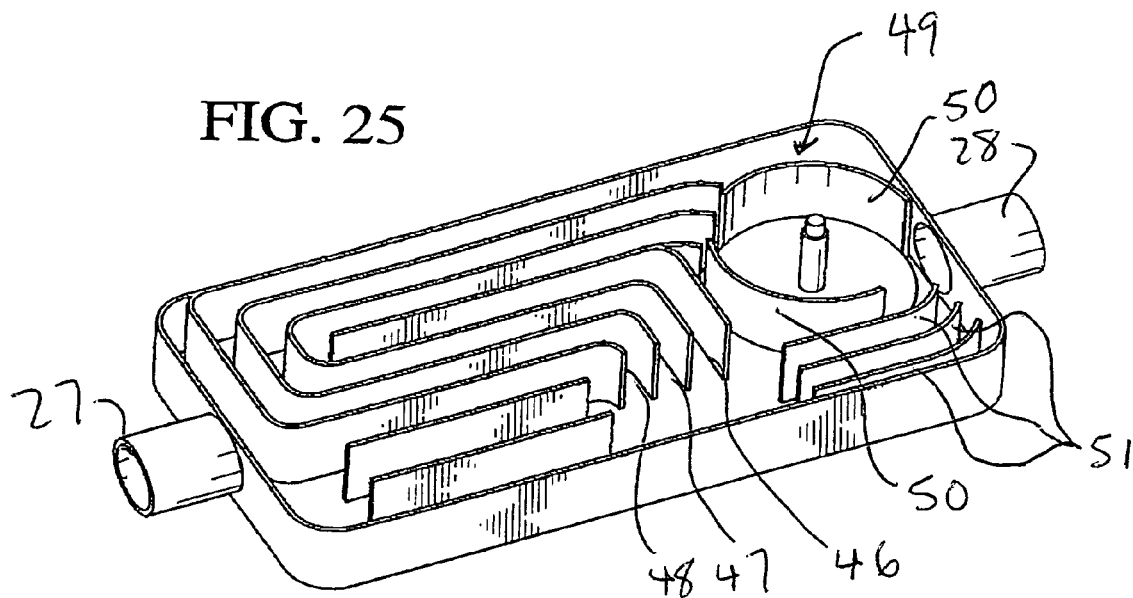
FIG. 25 is an isometric view of a tunable flow-through muffler constructed in accordance with the principles of a seventeenth preferred embodiment of the invention.
Figure 26:
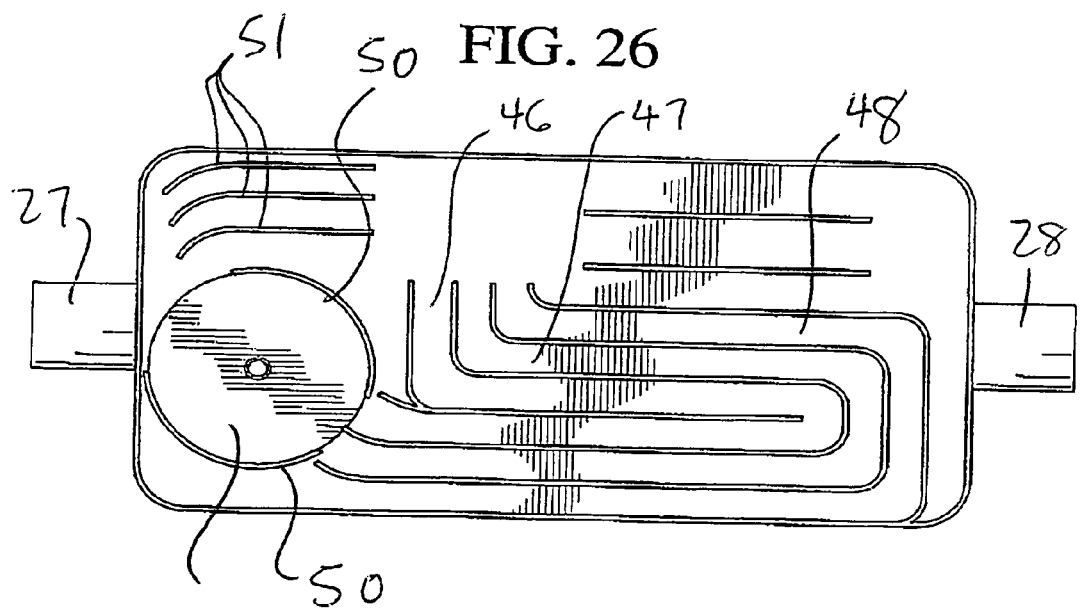
FIG. 26 is a plan view of the base portion of the tunable flow-through muffler of FIG. 25.

Yet another alternative approach to selection of sound cancelling chambers is illustrated in FIGS. 25 and 26, which are identical to FIGS. 23 and 24 except that the pivotal member 44 is replaced by a rotary valve 49 from which extends to arc-shaped walls 50 that form different size openings for selectively directing the inlet exhaust stream to multiple passages of different lengths. This embodiment includes walls 51 for further partitioning the inlet stream.

Figure 27:
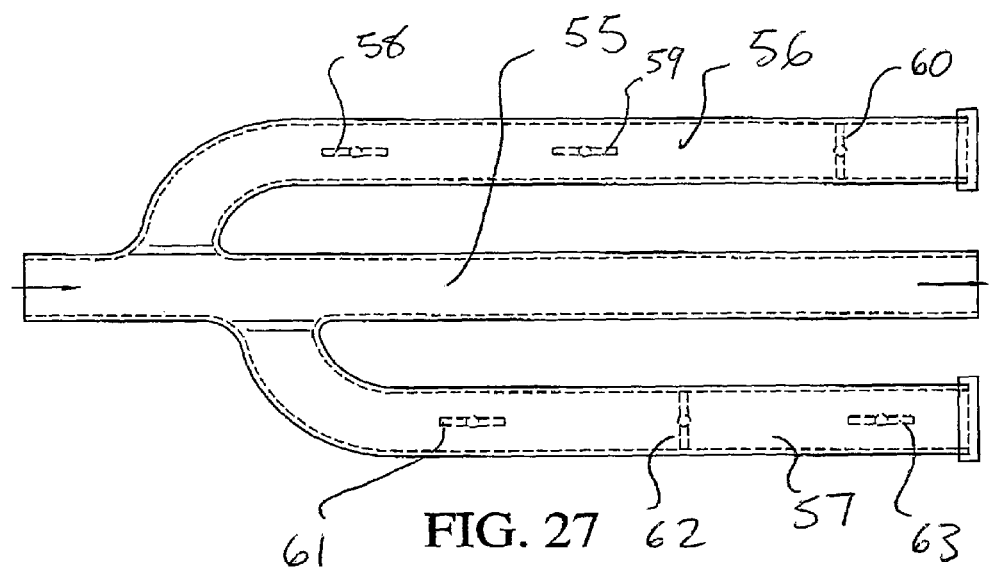
FIG. 27 is a plan view of a tunable flow-through muffler constructed in accordance with the principles of an eighteenth preferred embodiment of the invention.

The embodiment illustrated in FIG. 27 represents an especially simple design involving a main flow-through passage 55 and adjustable length reflection passages 56,57, each including a plurality of pivotal members 58-60, 61-62 which, when pivoted to a position transverse to the axis of a respective passage, terminates the passage at a pre-determined length, and when pivoted to a position parallel to the axis of the respective passage, has a minimal effect on acoustic waves in the passage. In the example illustrated in FIG. 27, members 60 and 62 define the length of passages 56 and 57, respectively. Such a path length adjustment mechanism can be used in connection with any of the embodiments illustrated herein, or any other flow-through muffler having passages that can be closed-off to affect its sound attenuation or cancelling characteristics.

Figure 28:
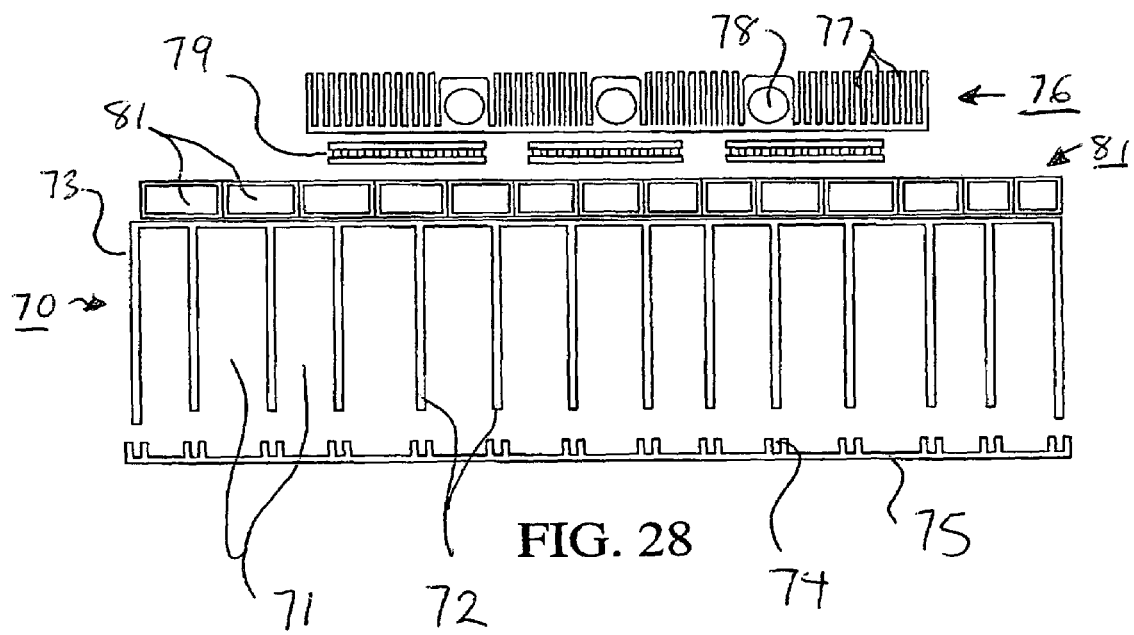
FIG. 28 is a cross-sectional end view of a flow-through muffler that further includes thermoelectric generators and a reformer, in accordance with the principles of a nineteenth preferred embodiment of the invention.

The embodiment illustrated in FIG. 28 includes a flow-through muffler body 10 having a plurality for passages 71 defined by walls 72 extending from upper housing member 73, which interlock with corresponding slots 74 in a substantially planar lower housing member or base 75. The passages 71 may have any of the configurations illustrated in FIGS. 1-27, as well as any other flow-through configuration having sound attenuation and/or cancellation properties. Walls 72 are arranged to conduct heat toward the upper surface of the upper housing member 73, while lower housing member 75 may be made of an insulating material.

The muffler of this embodiment further includes a heat exchanger 76 of the type described above in connection with FIGS. 1, 2, 4, and 12, with radiating fins 77 and fluid passages 78, for creating a temperature differential between the upper housing member 73 and the lower surface of the heat exchange. In this example, thermoelectric generator units 79 are connected between the housing member 73 and the heat exchanger 76 to utilize the temperature differential to generate electricity, as in the embodiments of FIGS. 1, 2, 4, and 12.

In addition to or instead of the thermoelectric generator units 79, this embodiment of the invention includes a plurality of passages 80 which are part of a reformer 81 for utilizes the thermal energy extracted from the exhaust stream as part of a hydrocarbon reformer so as to generate hydrogen gas from, by way of example, diesel fuel. Those skilled in the art will appreciate that the reformer of this embodiment may be combined with the flow-through muffler configurations illustrated in any of the above-described FIGS. 1-27, as well as in connection with other flow-through muffler configurations, whether or not tunable.

Having thus described preferred embodiments of the invention in sufficient detail to enable those skilled in the art to make and use the invention, it will nevertheless be appreciated that numerous variations and modifications of the illustrated embodiment may be made without departing from the spirit of the invention. Accordingly, it is intended that the invention not be limited by the above description or accompanying drawings, but that it be defined solely in accordance with the appended claims.

I claim:

1. A flow-through muffler, comprising:
   a housing including a lower section and a lid, and
   a plurality of internal baffles arranged to form unobstructed flow-through passages extending from an inlet to an outlet of said housing, said baffles being constructed of a heat conducting material, wherein said baffles form a plurality of passages in communication with an inlet chamber and a convergence chamber, said passages having different lengths, and sound carried by said passages being canceled in said convergence chamber; and
   at least one mechanism for diverting acoustic waves into passages of different predetermined lengths to adjust a wavelength canceled by acoustic waves exiting said passages in said convergence chamber.

2. A flow-through muffler as claimed in claim 1,
   wherein an exterior surface of one of said lower section and said lid is made of a heat conductive material,
   wherein said baffles extract heat from an exhaust stream passing through said passages and conduct said heat to an exterior surface of said muffler, and
   further comprising at least one thermo-electric generator in contact with said exterior surface, a heat exchanger for creating a heat differential across said thermo-electric generator.

3. A flow-through muffler as claimed in claim 2, further comprising an insulator surrounding said thermo-electric generator and situated between said heat exchanger and said exterior surface.

4. A flow-through muffler as claimed in claim 2, wherein said heat exchanger comprises a plurality of heat dissipating fins.

5. A flow-through muffler as claimed in claim 2, wherein said heat exchanger comprises a plurality of pipes for circulating coolant through said heat exchanger.

6. A flow-through muffler as claimed in claim 1, wherein at least said lower housing and at least a portion of said baffles form a one-piece casting.

7. A flow-through muffler as claimed in claim 6, wherein said lid include a portion of said baffles depending therefrom.

8. A flow-through muffler as claimed in claim 1, wherein said lower housing and at least a portion of said baffles are formed of sheet metal.

9. A flow-through muffler as claimed in claim 8, wherein said lid includes a portion of said baffles depending therefrom.

10. A flow-through muffler as claimed in claim 1, wherein said passages have an s-shape, including straight inlet passages, first intermediate passages extending transversely to said straight inlet passages, straight intermediate passages extending transversely from said first intermediate passages, second intermediate passages extending transversely from said second intermediate passages, and straight outlet passages extending transversely from said inlet passages and straight intermediate passages.

11. A flow-through muffler as claimed in claim 10, comprising two sets of said s-shaped passages, and further comprising additional outlet passages extending transversely for said straight outlet passages of each of said two sets of s-shaped passages, said additional outlet passages opening into a convergence chamber for cancelling sound waves that have passed through said s-shaped passages.

12. A flow-through muffler as claimed in claim 11, further comprising a straight central passage between said s-shaped passages for permitting direct passage of exhaust gases with minimal back-pressure.

13. A flow-through muffler as claimed in claim 1, wherein said baffles are zig-zag shaped structures extending between said inlet and said outlet and generally parallel to each other.

14. A flow-through muffler as claimed in claim 1, wherein said baffles comprise a plurality of walls extending from said lower housing transversely to a longitudinal axis of said housing extending from said inlet to said outlet, and a plurality of walls extending from said lid also in direction transverse to said longitudinal direction, said walls extending from said lid being staggered with respect to said walls extending from said lower housing so as to form at least one labyrinthine passage between said inlet and said outlet.

15. A flow-through muffler as claimed in claim 1, wherein said baffles form a central flow-through passage between said inlet and said outlet, and a plurality for side passages in communication with an inlet side of said central passage, said side passages being closed at one end and arranged to reflect acoustic energy so as to cancel or dissipate the acoustic energy in the passages.

16. A flow-through muffler as claimed in claim 1, wherein said baffles from a plurality of wavy walls extending parallel to a longitudinal axis extending from said inlet to said outlet.

17. A flow-through muffler as claimed in claim 16, further comprising flow-diverting walls at least at an inlet side of said baffles.

18. A flow-through muffler as claimed in claim 1, further comprising flow-diverting walls at least at an inlet side of said baffles.

19. A flow-through muffler as claimed in claim 1, wherein said baffles are formed by a plurality of tubes extending transversely from one of said lower housing and said lid.

20. A flow-through muffler as claimed in claim 19, wherein said plurality of tubes further form a flow diverting on at least an inlet side of a main section of said tubes.

21. A flow-through muffler as claimed in claim 1, wherein said baffles extend from said lid.

22. A flow-through muffler as claimed in claim 1, further comprising a mechanism for adjusting a length of at least one of said passages relative to a length of another one of said passages to adjust a wavelength canceled by acoustic waves exiting said passages in said convergence chamber.

23. A flow-through muffler as claimed in claim 22, wherein said mechanism adjusts lengths of at least first set of said passages relative to lengths of a second set of said passages.

24. A flow-through muffler as claimed in claim 23, wherein said passages in said first set comprise fixed sections and telescoping sections that fit within and are moveable relative to said fixed sections to adjust lengths of passages formed by said fixed and telescoping sections.

25. A flow-through muffler as claimed in claim 24, wherein said telescoping sections are manually movable.

26. A flow-through muffler as claimed in claim 24, wherein said telescoping sections are movable by a motor.

27. A flow-through muffler as claimed in claim 26, further comprising a motor controller for controlling said motor in response to signals output by a MAPS sensor and a motor speed or RPM detector.

28. A flow-through muffler as claimed in claim 22, further comprising at least two passages and said mechanism comprises an adjustable wall section forming a movable wall of one of said passages to adjust a length of said one of the passages and thereby adjust a frequency of sound canceled in said convergence chamber.

29. A flow-through muffler as claimed in claim 28, wherein said adjustable wall section is a u-shaped member slidable in one of said passages.

30. A flow-through muffler as claimed in claim 29, wherein said u-shaped member is manually adjustable.

31. A flow-through muffler as claimed in claim 29, wherein said u-shaped member is adjustable by a motor.

32. A flow-through muffler as claimed in claim 31, wherein said u-shaped member is connected to said motor by a screw drive.

33. A flow-through muffler as claimed in claim 31, further comprising a motor controller for controlling said motor in response to signals output by a MAPS sensor and a motor speed or RPM detector.

34. A flow-through muffler as claimed in claim 28, further comprising a second said adjustable wall section.

35. A flow-through muffler as claimed in claim 28, further comprising at least three said adjustable wall sections.

36. A flow-through muffler as claimed in claim 1, further comprising at least one mechanism for diverting acoustic waves into passages of different predetermined lengths to adjust a wavelength canceled by acoustic waves exiting said passages in said convergence chamber.

37. A flow-through muffler as claimed in claim 36, wherein said mechanism comprises a pivotal flow diverter member.

38. A flow-through muffler as claimed in claim 36, wherein said mechanism comprises a rotary valve.

39. A flow-through muffler as claimed in claim 1, wherein a path length difference between said passages in feet is 1875 multiplied by a number of cylinders in an engine connected to said muffler, divided by a speed of the engine (RPM) and the number of revolutions per firing of each cylinder.

40. A flow-through muffler as claimed in claim 39, wherein said path length difference is 7500/RPM for an eight cylinder engine with two revolutions between firings.

41. A flow-through muffler as claimed in claim 1, further comprising length-defining members situated in said passages for defining lengths of said passages.

42. A flow-through muffler as claimed in claim 41, wherein said length defining members are pivotal members arranged to pivot to a position transverse to axes of respective passages in order to terminate the passages and thereby define their lengths.

43. A flow-through muffler as claimed in claim 1, wherein an exterior surface of one of said lower section and said lid is made of a heat conductive material,
wherein said baffles extract heat from an exhaust stream passing through said passages and conduct said heat to an exterior surface of said muffler, and
further comprising a heat exchanger and a reformer situated between said exterior surface of said housing and said heat exchanger.

44. A flow-through muffler as claimed in claim 43, wherein said reformer is arranged to convert diesel fuel into hydrogen gas.

45. A flow-through muffler as claimed in claim 1, wherein said baffles are coated with a catalyst selected to reduce pollutants in the exhaust stream.

46. A tuneable muffler, comprising an input, a cancellation chamber, and an output in communication with the cancellation chamber, and a plurality of passages having different lengths and extending between the input and the cancellation chamber, and further comprising an adjustment device for varying a length of at least one of said plurality of passages in order to vary a frequency of acoustic waves canceled in said cancellation chamber.

47. A tuneable muffler as claimed in claim 46, wherein a first set of said plurality of passages comprise fixed sections and telescoping sections that fit within and are moveable relative to said fixed sections to adjust lengths of passages formed by said fixed and telescoping sections.

48. A flow-through muffler as claimed in claim 47, wherein said telescoping sections are manually movable.

49. A flow-through muffler as claimed in claim 47, wherein said telescoping sections are movable by a motor.

50. A flow-through muffler as claimed in claim 49, further comprising a motor controller for controlling said motor in response to signals output by a MAPS sensor and a motor speed or RPM detector.

51. A flow-through muffler as claimed in claim 46, further comprising at least two passages and said mechanism comprises an adjustable wall section forming a movable wall of one of said passages to adjust a length of said one of the passages and thereby adjust a frequency of sound canceled in said convergence chamber.

52. A flow-through muffler as claimed in claim 51, wherein said adjustable wall section is a u-shaped member slidable in one of said passages.

53. A flow-through muffler as claimed in claim 52, wherein said u-shaped member is manually adjustable.

54. A flow-through muffler as claimed in claim 52, wherein said u-shaped member is adjustable by a motor.

55. A flow-through muffler as claimed in claim 54, wherein said u-shaped member is connected to said motor by a screw drive.

56. A flow-through muffler as claimed in claim 54, further comprising a motor controller for controlling said motor in response to signals output by a MAPS sensor and a motor speed or RPM detector.

57. A flow-through muffler as claimed in claim 51, further comprising a second said adjustable wall section.

58. A flow-through muffler as claimed in claim 51, further comprising at least three said adjustable wall sections.

59. A flow-through muffler as claimed in claim 46, further comprising at least one mechanism for diverting acoustic waves into passages of different predetermined lengths to adjust a wavelength canceled by acoustic waves exiting said passages in said convergence chamber.

60. A flow-through muffler as claimed in claim 59, wherein said mechanism comprises a pivotal flow diverter member.

61. A flow-through muffler as claimed in claim 59, wherein said mechanism comprises a rotary valve.

62. A flow-through muffler as claimed in claim 46, wherein a path length difference between said passages in feet is 1875 multiplied by a number of cylinders in an engine connected to said muffler, divided by a speed of the engine (RPM) and the number of revolutions per firing of each cylinder.

63. A flow-through muffler as claimed in claim 62, wherein said path length difference is 7500/RPM for an eight cylinder engine with two revolutions between firings.

64. A flow-through muffler as claimed in claim 46, further comprising length-defining members situated in said passages for defining lengths of said passages.

65. A flow-through muffler as claimed in claim 64, wherein said length defining members are pivotal members arranged to pivot to a position transverse to axes of respective passages in order to terminate the passages and thereby define their lengths.

* * * * *

UNITED STATES PATENT AND TRADEMARK OFFICE
CERTIFICATE OF CORRECTION

PATENT NO.       : 7,610,993 B2                                    Page 1 of 1
APPLICATION NO.  : 11/211701
DATED            : November 3, 2009
INVENTOR(S)      : John Timothy Sullivan It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 470 days.

Signed and Sealed this

Twelfth Day of October, 2010

David J. Kappos
*Director of the United States Patent and Trademark Office*